United States Patent [19]
Kuriyama

[11] Patent Number: 5,945,715
[45] Date of Patent: Aug. 31, 1999

[54] SEMICONDUCTOR MEMORY DEVICE HAVING A MEMORY CELL REGION AND A PERIPHERAL CIRCUIT REGION AND METHOD OF MANUFACTURING THE SAME

[75] Inventor: Hirotada Kuriyama, Hyogo, Japan

[73] Assignee: Mitsubishi Denki Kabushiki Kaisha, Tokyo, Japan

[21] Appl. No.: 08/923,113

[22] Filed: Sep. 4, 1997

Related U.S. Application Data

[63] Continuation of application No. 08/559,674, Nov. 20, 1995, abandoned.

[30] Foreign Application Priority Data

May 29, 1995 [JP] Japan .................................. 7-130406

[51] Int. Cl.[6] .......................... H01L 29/76; H01L 29/94; H01L 31/062; H01L 31/113
[52] U.S. Cl. .......................... 257/369; 257/393; 257/368
[58] Field of Search .................................. 257/369, 371, 257/372, 373, 393, 296, 378, 544, 303; 437/52, 56

[56] References Cited

U.S. PATENT DOCUMENTS

| | | | |
|---|---|---|---|
| 3,921,283 | 11/1975 | Shappir | 257/371 |
| 4,145,233 | 3/1979 | Sefick et al. . | |
| 4,907,058 | 3/1990 | Sakai | 257/296 |
| 4,937,645 | 6/1990 | Ootsuka et al. | 257/296 |
| 5,072,275 | 12/1991 | Vora | 257/369 |
| 5,079,613 | 1/1992 | Sawada et al. | 257/544 |
| 5,138,420 | 8/1992 | Komori et al. | 257/371 |
| 5,148,255 | 9/1992 | Nakazato et al. | 257/378 |
| 5,159,426 | 10/1992 | Harrington, III | 257/369 |
| 5,160,996 | 11/1992 | Odanaka | 257/374 |
| 5,258,645 | 11/1993 | Sato | 257/369 |
| 5,264,712 | 11/1993 | Murata et al. | 257/303 |
| 5,281,842 | 1/1994 | Yasuda et al. | 257/371 |
| 5,304,833 | 4/1994 | Shigeki et al. | 257/369 |
| 5,362,981 | 11/1994 | Sato et al. | 257/369 |
| 5,373,476 | 12/1994 | Jeon | 257/369 |
| 5,489,794 | 2/1996 | Nonaka et al. | 257/369 |
| 5,576,570 | 11/1996 | Ohsawa et al. | 257/369 |
| 5,693,976 | 12/1997 | Chao | 438/221 |

FOREIGN PATENT DOCUMENTS

| | | | |
|---|---|---|---|
| 57-45969 | 3/1982 | Japan | 257/369 |
| 7155768 | 9/1982 | Japan | 257/369 |
| 60-47455 | 3/1985 | Japan | 257/369 |
| 60-83363 | 5/1985 | Japan | 257/369 |
| 3296368 | 12/1988 | Japan | 257/369 |
| 1187970 | 7/1989 | Japan | 257/369 |
| 4370965 | 12/1992 | Japan . | |

OTHER PUBLICATIONS

Fumitomo Matsuoka et al, High–density Full–CMOS SRAM Cell Technology with a Deep Sub–Micron Spacing between nMOS and pMOSEFET, IEICE Trans, Electron., vol. E77–C, No. 8, Aug. 1994, pp. 1385–1394.

*Primary Examiner*—Olik Chaudhuri
*Assistant Examiner*—Phat X. Cao
*Attorney, Agent, or Firm*—McDermott, Will & Emery

[57] ABSTRACT

LOCOS isolation is used for isolation between wells in a memory cell part, and an isolation width is reduced, so that a degree of integration of memory cells is improved in a semiconductor memory device. At the memory cell part in the semiconductor memory device, depths of a well region and source/drain regions are reduced, so that a width of an element isolating insulation film are reduced.

8 Claims, 33 Drawing Sheets

MEMORY CELL PART

PERIPHERAL CIRCUITRY

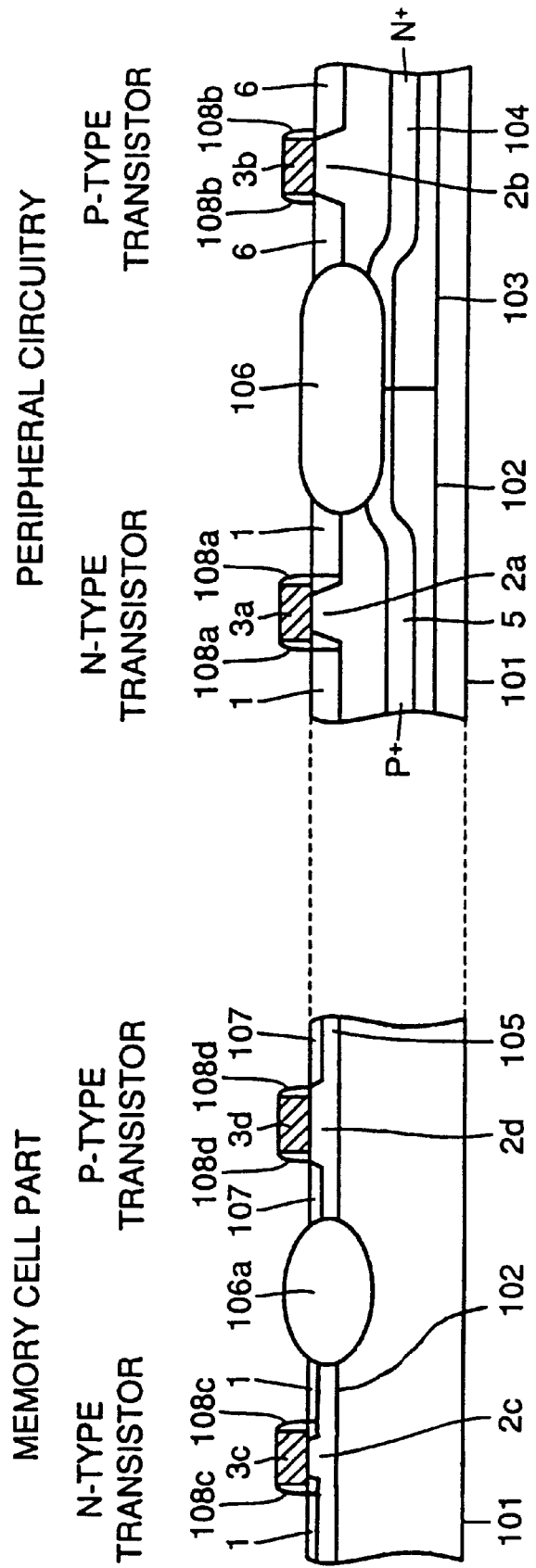

SEMICONDUCTOR MEMORY DEVICE HAVING A MEMORY CELL REGION AND A PERIPHERAL CIRCUIT REGION AND METHOD OF MANUFACTURING THE SAME

This application is a continuation of application Ser. No. 08/559,674 filed Nov. 20, 1995, now abandoned.

BACKGROUND OF THE INVENTION

1. Field of the Invention

The present invention relates to a semiconductor memory device and a method of manufacturing the same, and in particular to a structure of an SRAM (Static Random Access Memory) and a method of manufacturing the same.

2. Description of the Background Art

Static random access memories have been known as a kind of semiconductor memory devices. FIG. 18 is an equivalent circuit diagram showing one memory cell in an SRAM. Referring to FIG. 18, the memory cell employs a p-type MOS (Metal Oxide Semiconductor) transistor as a load, and is formed of six transistors. More specifically, a pair of driver transistors Q1 and Q2 (n-type MOS transistors) and a pair of load transistors Q5 and Q6 (p-type MOS transistors) are mutually connected to form a flip-flop circuit.

Source regions of paired load transistors Q5 and Q6 are connected to a power supply Vcc, and source regions of driver transistors Q1 and Q2 are connected to grounds 212 and 213, respectively.

A pair of access transistors Q3 and Q4 (n-type MOS transistors) are connected to storage nodes 214 and 215, respectively. One of source/drain regions of access transistor Q3 is connected to a bit line 207, and the other of source/drain regions of access transistor Q4 is connected to a bit line 208. Gate electrodes of access transistors Q3 and Q4 are connected to a word line 209.

The SRAM includes a memory cell part and a peripheral circuitry. Peripheral circuitry serves to write information into the memory cell part and read information therefrom.

Structures of the memory cell part and peripheral circuitry in the conventional SRAM will be described below. FIG. 19 is a cross section showing the memory cell part and peripheral circuitry in the conventional SRAM.

Referring to FIG. 19, a CMOS (Complementary MOS) transistor formed of N-type and P-type MOS transistors is formed at each of the peripheral circuitry and memory cell part. More specifically, the memory cell part is provided at a main surface of a semiconductor substrate 101 with a P-type well region 102 and an N-type well region 103 neighboring to each other. An element isolating insulation film 106 located at a boundary between P-type and N-type well regions 102 and 103 is formed on the main surface of semiconductor substrate 101. A P$^+$-isolation region 5 is formed and buried in P-type well region 102 for preventing formation of a parasitic transistor, which may cause a problem relating to latch-up, and isolating N-type MOS transistors from each other. Similarly, N$^+$-isolation region 104 is formed and buried in N-type well region 103.

At predetermined regions of the main surface of P-type well region 102, there are formed a pair of N-type source/drain regions 1 spaced by a predetermined distance with a channel region 2c therebetween. A gate electrode 3c is formed on channel region 2c with a gate insulation film therebetween. Side wall insulation films 108c are formed in contact with opposite side surfaces of gate electrode 3c. Gate electrode 3c and paired N-type source/drain regions 1 form the N-type MOS transistor. At predetermined regions of the main surface of N-type well region 103, there are formed a pair of P-type source/drain regions 6 spaced by a predetermined distance with a channel region 2d therebetween. A gate electrode 3d is formed on channel region 2d with a gate insulation film therebetween. Side wall insulation films 108d are formed in contact with opposite side surfaces of gate electrode 3d. Gate electrode 3d and paired P-type source/drain regions 6 form the P-type MOS transistor.

Similarly to the memory cell part, the peripheral circuitry is provided at the main surface of semiconductor substrate 101 with P-type well region 102, N-type well region 103, element isolating insulation film 106, P$^+$-isolation region 5, N$^+$-isolation region 104, N-type source/drain regions 1, gate electrode 3a, side wall insulation films 108a and P-type source/drain regions 6.

FIGS. 20 through 29 are cross sections showing a process of manufacturing the conventional SRAM shown in FIG. 19. Referring to FIGS. 20 through 29, the process of manufacturing the conventional SRAM will be described below. FIG. 20 shows semiconductor substrate 101 of the memory cell part and peripheral circuitry. As shown in FIG. 21, an SiON film 101a is deposited on semiconductor substrate 101, and an SiN film 101b is deposited thereon.

As shown in FIG. 22, a region for forming an active region is covered with a resist 101c, and then etching is effected on SiN film 101b, SiON film 101a and semiconductor substrate 101.

As shown in FIG. 23, resist 101c is removed, and then element isolating insulation films 106 made of SiO$_2$ are formed by the LOCOS (Local Oxidation of Silicon) method. As shown in FIG. 24, SiN film 101b and SiON film 101a are removed. In this manner, element isolating insulation films 106, which are buried more deeply at the substrate surface than the ordinary structure, are formed at the predetermined regions in the main surface of the semiconductor substrate.

Then, as shown in FIG. 25, a resist 109 is formed to cover regions at which the P-type transistors of both the peripheral circuitry and memory cell part are to be formed, and P-type wells 102 and P$^+$-isolation regions 5 of both the memory cell part and peripheral circuitry are formed by ion implantation.

As shown in FIG. 26, regions at which N-type transistors are to be formed are covered with resist 109, and N-type well regions 103 and N$^+$-isolation regions 104 are formed by ion implantation at regions for forming the P-type transistors of the memory cell part and peripheral circuitry.

As shown in FIG. 27, after forming gate electrodes 3a, 3b, 3c and 3d made of N-type polycrystalline silicon at predetermined regions on the semiconductor substrate, the regions for forming the P-type transistors of both the memory cell part and peripheral circuitry are covered with resist 109 as shown in FIG. 28. Then, using gate electrodes 3a and 3c as a mask, impurity is ion-implanted at a low concentration into regions for forming the N-type transistors of both the memory cell part and peripheral circuitry, whereby lightly doped impurity regions are formed. After removing resist 109, side wall insulation films 108a, 108b, 108c and 108d are formed in contact with opposite side surfaces of gate electrodes 3a, 3b, 3c and 3d, respectively. Using side wall insulation films 3a, 3b, 3c and 3d as a mask, ion-implantation is performed again to form heavily doped impurity regions, so that source/drain regions 1 of the LDD (Lightly Doped Drain) structure are formed. Thereafter, resist 109 is removed.

As shown in FIG. 29, regions for forming the N-type transistors are covered with resist 109, and P-type impurity is ion-implanted only into a region for forming the P-type transistor of the peripheral circuitry, whereby source/drain regions 6 are formed. Thereafter, resist 109 is removed.

In this manner, the conventional semiconductor memory device of SRAM shown in FIG. 19 is completed.

In the conventional SRAM, it is necessary to reduce plane areas occupied by respective memory cells in order to improve the degree of integration of memory cells.

For this purpose, there has been proposed a structure in which a TFT (Thin Film Transistor) is used as the P-type transistor, four elements are formed on the substrate and two elements are formed thereon, so that the cell size is reduced.

In the above structure, however, it is difficult to achieve an intended current performance of the TFT with a low voltage, and hence it is difficult to achieve stable low-voltage operation at a recently used voltage not higher than 3 V with the TFT load. In order to solve the above problem, the following reference has proposed a substrate P-type transistor having an improved performance.

More specifically, the following two problems are solved in ICICE TRANS ELECTRON, VOL. E77-C, No. 8 AUGUST 1994 "High-Density Full-CMOS SRAM Cell Technology with a deep Sub-Micron Spacing between n MOS and p MOSFET". According to the above reference, the first problem is that LOCOS isolation in the prior art cannot sufficiently reduce an isolation width between wells. By the use of trench isolation, the isolation width between wells is reduced, and thereby the cell size is reduced.

More specifically, in the conventional CMOS structure using the LOCOS isolation, if the isolation width between P-type and N-type wells is reduced, such a problem arises that parasitic thyristor operation generates latch-up. In general, the latch-up is a phenomenon that, in the bulk CMOS structure, a parasitic thyristor element is turned on and a large current flows, e.g., between power supply terminals of the CMOS circuit, so that circuit operation is impeded and/or the IC itself is destroyed. FIG. 30 shows a parasitic thyristor structure of the bulk CMOS IC having an N-type well structure. In this structure, it is assumed that a voltage lower than Vss is applied to an $n^+$-drain 302, and electrons are implanted from $n^+$-region 302 into a p-type substrate 300. Electrons are partially gathered in an n-well 303 (i.e., collector of a horizontal npn transistor Tnpn) and reach an $n^+$-region 304 through n-well 303. This current flows through a resistance 305 of well 303 in FIG. 30. If this current is sufficiently large and the pn junction at the source side of pMOS is biased forward due to voltage drop by resistance 305, a vertical pnp transistor 306 is turned on, and a collector current caused by holes flows through p-type substrate 300. If this current is large enough to cause the forward bias of the pn junction at the source side of nMOS transistor due to voltage drop by a resistance 309, then the horizontal npn transistor is turned on, and the collector current thereof sets pnp transistor 306 to a more deeply conductive state. While positive feedback is being applied in this manner, such a state is maintained that a large current flows between Vcc and Vss regardless of a current from an $n^+$-drain which initially formed a trigger. In order to escape from this state, it is necessary to cut off a current (holding current) itself flowing into a parasitic thyristor. The latch-up tends to improve characteristics of the parasitic thyristor as the CMOS IC is miniaturized to a higher extent, and this forms a serious problem in connection with densification of the CMOS IC.

Reduction the isolation width between P-type well 102 and N-type well 103 already described reduces a resistance value between these wells 102 and 103, and promotes flow of a current which causes the latch-up.

Therefore, it is necessary to keep the isolation width of a certain value or more when using the LOCOS isolation.

Meanwhile, in the case where the trench isolation is used, an isolation between the wells is deep and hence a resistance by the isolation is large, so that flow of a current causing the latch-up is suppressed. Therefore, the problem relating to the latch-up is suppressed even if the isolation width is reduced. FIG. 31 is a cross section of a general structure using the trench isolation. Isolation 150 formed of trenches completely isolates P-type and N-type wells 102 and 103 from each other through its entire thickness. Therefore, current flow between the wells is extremely suppressed as already described, so that the problem relating to latch-up is suppressed.

However, the following three problems arise in the memory cell using the trench isolation. First, the trench isolation requires a CMP (Chemical Mechanical Polishing) technique which is a highly precise flattening technique for leaving an oxide film only in the trench. Therefore, the trench isolation requires a complicated manufacturing process as compared with the conventional LOCOS isolation requiring only an etching step and an oxidation step.

Second, the trench isolation tends to form a parasitic MOS transistor at the side wall of the trench, which disadvantageously increases subthreshold leak. In order to prevent this, it is necessary to implant $P^+$-type impurity into the isolation portion as described below, which complicates the manufacturing process. Implantation of the $P^+$-type impurity is shown in FIGS. 32 and 33. FIG. 32 is a plan of an N-type MOS transistor, and FIG. 33 is a cross section taken along line 200—200 in FIG. 32. Referring to FIGS. 32 and 33, the transistor includes N-type active regions 1, trench isolation 2 and gate electrode 3. It is assumed that one of N-type active regions 1 located at left side in FIG. 32 is a drain region, and the other at the right side is a source region. At portions a1 and a2 in FIG. 32, a leak current flows as indicated by arrows in the figure. In FIG. 33, there are shown gate electrode 3, gate oxide film 4 and $P^+$-isolation regions 5 of isolating portion. Referring to FIG. 33, since the concentration of $P^+$-type impurity is low at portions a1 and a2 in FIG. 33, a current flows even if the gate electrode is lower than the threshold voltage, so that a $P^+$-leak current flows. In order to prevent this leak current, it is necessary to implant newly $P^+$-type impurity into portions a1 and a2.

Third, the trench isolation tends to cause a junction leak current as compared with the LOCOS isolation. In order to suppress this, it is necessary to round the corner of the trench isolating portion by oxidation and/or to provide a tapered trench, which complicates the manufacturing process.

As described above, if the trench isolation is used instead of the LOCOS isolation in order to reduce plane areas occupied by memory cells, various problems described above arise.

SUMMARY OF THE INVENTION

A first object of the invention is to provide a semiconductor memory device, which does not use the trench isolation but uses the LOCOS isolation, and which can reduce plane areas occupied by memory cells and thereby can increase a degree of integration of memory cells.

Another object of the invention is to provide a method of manufacturing a semiconductor memory device, which can easily form the semiconductor memory device having the LOCOS isolation and allowing increase of a degree of integration of memory cells.

A semiconductor memory device according to an aspect of the invention, which includes a memory cell region and a peripheral circuit region, includes a first well region, first source/drain regions, a first gate electrode, a first element isolating insulation film, a second well region, second source/drain regions, a second gate electrode, and a second element isolating insulation film. The first well region has a first depth from a main surface of a semiconductor substrate, and has a first conductivity type. The first source/drain regions are formed at predetermined regions of a main surface of the first well region, have a second depth from the main surface of the first well region, are spaced by a predetermined distance from each other with a first channel region therebetween, and have a second conductivity type. The first gate electrode is formed on the first channel region with a first gate insulation film therebetween. The first element isolating insulation film is formed at a main surface of the memory cell region, and is located at a region neighboring to the first source/drain regions. The second well region is formed at the main surface of the semiconductor substrate in the peripheral circuit region, has a third depth from the main surface of the semiconductor substrate, and has the first conductivity type. The second source/drain regions are formed at predetermined regions of a main surface of the second well region, have a fourth depth from the main surface of the second well region, are spaced by a predetermined distance with a second channel region therebetween, and have the second conductivity type. The second gate electrode is formed on the second channel region with a second gate insulation film therebetween. The second element isolating insulation film is formed at a region located in the main surface of the peripheral circuit region and neighboring to the second source/drain regions. According to this semiconductor memory device, the first depth of the first well region in the memory cell region is shallower than the third depth of the second well region in the peripheral circuit region, and the second depth of the first source/drain regions in the memory cell region is shallower than the fourth depth of the second source/drain regions in the peripheral circuit region.

According to the above aspect, a resistance value of a resistance, which may cause latch-up as already described in connection with the prior art, is small owing to reduction of a distance between the n⁺-region and n-type well region. Therefore, a problem relating to the latch-up is suppressed, and the first element isolating insulation film in the memory cell region can have smaller sizes than the second element isolating insulation film in the peripheral circuit region.

A method of manufacturing a semiconductor memory device according to another aspect of the invention, a first element isolating insulation film is formed at a predetermined region on a main surface of a memory cell region. A second element isolating insulation film is formed at a predetermined region on a main surface of a peripheral circuit region. Impurity of a first conductivity type is ion-implanted into a first region formed of one of portions of the main surface of the memory cell region isolated by the first element isolating insulation film to form a first well region having a first depth from the main surface of the memory cell region. Impurity of the first conductivity type is ion-implanted into a second region formed of one of portions of the main surface of the peripheral circuit region isolated by the second element isolating insulation film to form a second well region having a second depth larger than the first depth from the main surface of the peripheral circuit region. A first gate electrode is formed at a predetermined position in the first region. A second gate electrode is formed at a prede-termined position in the second region. Impurity of a second conductivity type is ion-implanted into the main surface of the first well region to form first source/drain regions having a third depth, using the first gate electrode as a mask. Impurity of the first conductivity type is ion-implanted into the main surface of the second well region to form second source/drain regions having a fourth depth larger than the third depth, using the second gate electrode as a mask.

According to the above aspect, a resistance value of a resistance, which may cause latch-up as already described in connection with the prior art, is small owing to reduction of a distance between the n⁺-region and n-type well region, and thus a problem relating to the latch-up is suppressed. Therefore, the method can easily manufacture the semiconductor memory device, in which the first element isolating insulation film in the memory cell region has a smaller size than the second element isolating insulation film in the peripheral circuit region, and thus a problem relating to latch-up is suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 34 is a cross section showing a semiconductor device in accordance with another embodiment of the present invention.

DESCRIPTION OF THE PREFERRED EMBODIMENTS

First Embodiment

Figure 1:
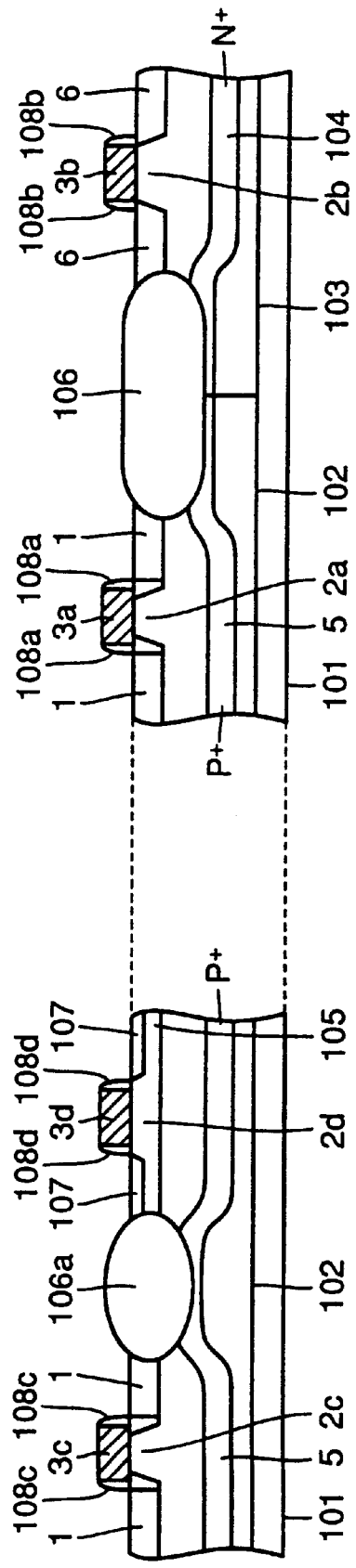
FIG. 1 is a cross section showing a semiconductor memory device of a first embodiment of the invention.
Figure 2:
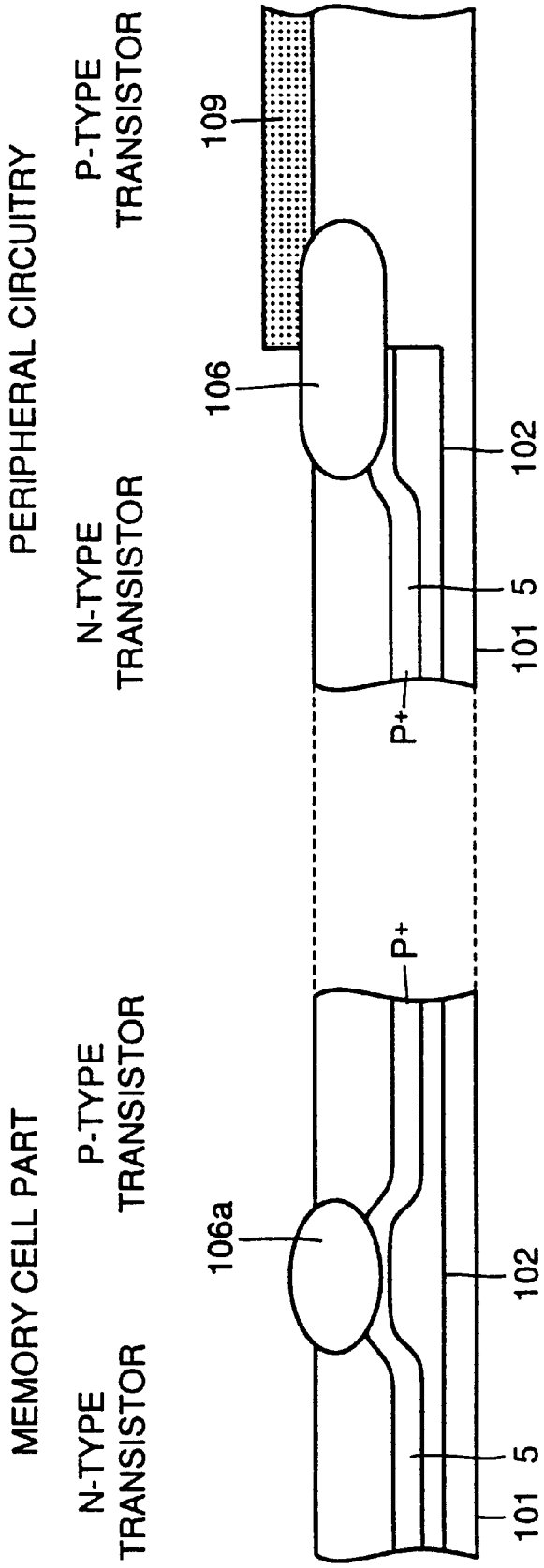
FIGS. 2–8 are cross sections showing 1st through 7th steps in a process of manufacturing the semiconductor memory device of the first embodiment shown in FIG. 1.

Embodiments of the invention will be described below with reference to the drawings. Referring to FIG. 1, a semiconductor memory device of a first embodiment of the invention will be described below.

In each of a peripheral circuitry and a memory cell part, there is formed a CMOS (Complementary MOS) transistor formed of N-type and P-type MOS transistors. In FIG. 1, substrate 101 is of the N-type, but it may be of the P-type. Although LOCOS isolation 106 includes an oxide film filling an isolating portion such as a trench in the figure, it may be of another type provided that isolation is effected by oxidation of the substrate, and the isolation is not restricted to the LOCOS isolation.

In the peripheral circuitry shown in FIG. 1, P-type well region 102 and N-type well region 103 neighboring to each other are formed at the main surface of semiconductor substrate 101. Element isolating insulation film 106 is formed on the main surface of semiconductor substrate 101, and is located at a boundary region between P-type and N-type well regions 102 and 103. $P^+$-isolation region 5 is buried in P-type well region 102 for preventing latch-up and isolating the N-type MOS transistors from each other. $N^+$-type isolation region 104 is buried in N-type well region 103. A pair of N-type source/drain regions 1 are formed at predetermined regions of the main surface of P-type well region 102 and are spaced by a predetermined distance with a channel region 2a therebetween. Gate electrode 3a is formed on channel region 2a with a gate insulation film therebetween. Side wall insulation films 108a are formed in contact with opposite side surfaces of gate electrode 3a. Gate electrode 3a and paired N-type source/drain regions 1 form an N-type MOS transistor. A pair of P-type source/drain regions 6 are formed at predetermined regions of the main surface of N-type well region 103 and are spaced by a predetermined distance with a channel region 2b therebetween. Gate electrode 3b is formed on channel region 2b with a gate insulation film therebetween. Side wall insulation films 108b are formed in contact with opposite side surfaces of gate electrode 3b. Gate electrode 3b and paired P-type source/drain regions 6 form a P-type MOS transistor.

In the memory cell part shown in FIG. 1, P-type well region 102 is formed on the whole main surface of semiconductor substrate 101. A pair of N-type source/drain regions 1 are formed at predetermined regions of the main surface of P-type well region 102 and are spaced by a predetermined distance with a channel region 2c therebetween. N-type well region 105 is formed at a predetermined region of the main surface of P-type well region 102. An element isolating insulation film 106a is formed on the main surface of semiconductor substrate 101, and is located at a boundary region between N-type source/drain region 1 and N-type well region 105. $P^+$-isolation region 5 is buried in P-type well region 102 for preventing formation of a parasitic transistor and thereby preventing latch-up and for isolating N-type MOS transistors from each other. Gate electrode 3c is formed on channel region 2c with a gate insulation film therebetween. Side wall insulation films 108c are formed in contact with opposite side surfaces of gate electrode 3c. Gate electrode 3c and paired N-type source/drain regions 1 form an N-type MOS transistor. A pair of P-type source/drain regions 107 are formed at predetermined regions of the main surface of N-type well 105 and are spaced by a predetermined distance with a channel region 2d therebetween. Gate electrode 3d is formed on channel region 2d with a gate insulation film therebetween. Side wall insulation films 108d are formed in contact with opposite side surfaces of gate electrode 3d. Gate electrode 3d and paired P-type source/drain regions 107 form a P-type MOS transistor.

Figure 19:
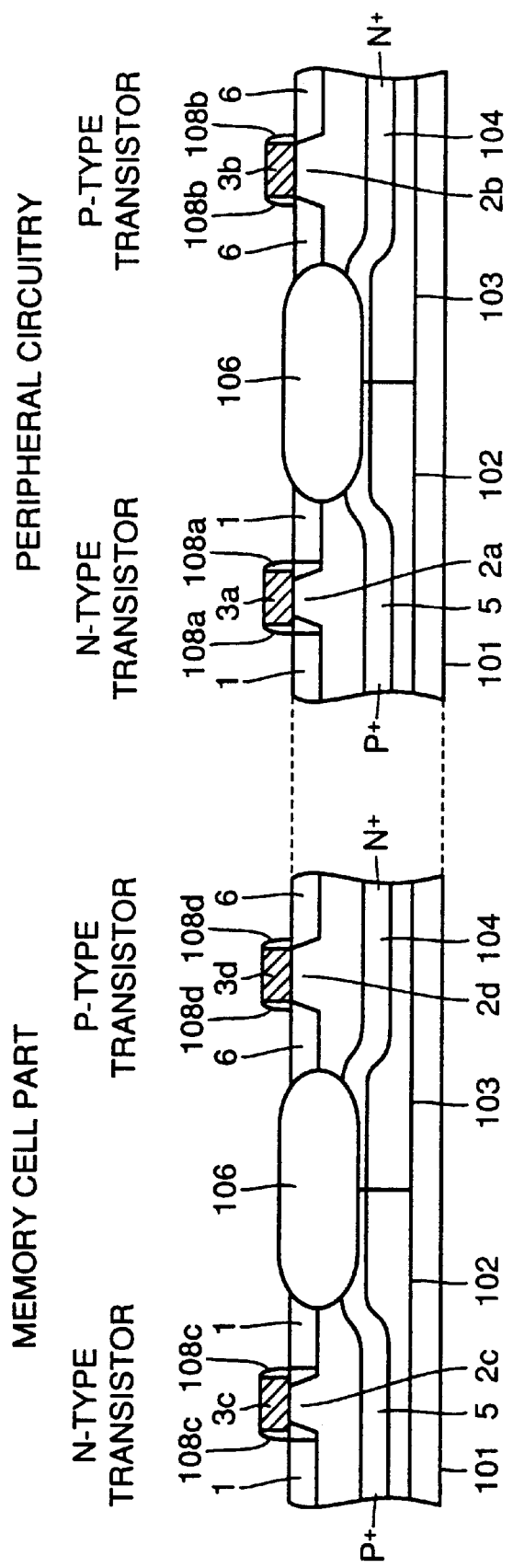
FIG. 19 is a cross section of a conventional semiconductor memory device.
Figure 20:
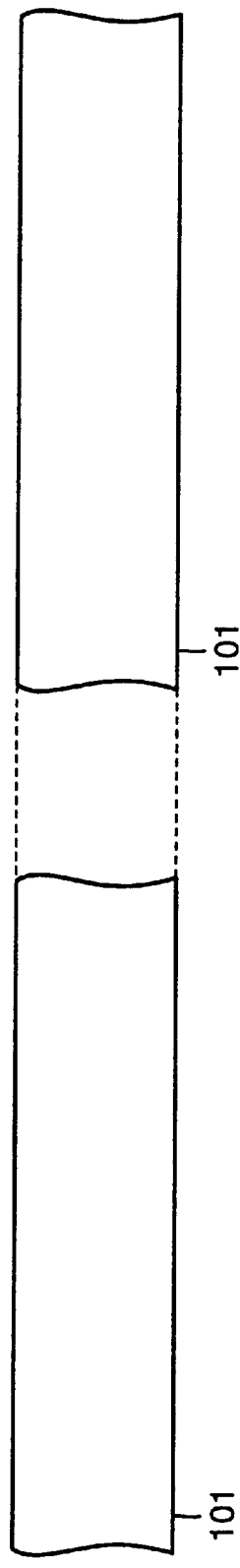
FIGS. 20–29 are cross sections showing 1st through 10th steps in the process of manufacturing the conventional semiconductor memory device shown in FIG. 19.
Figure 21:
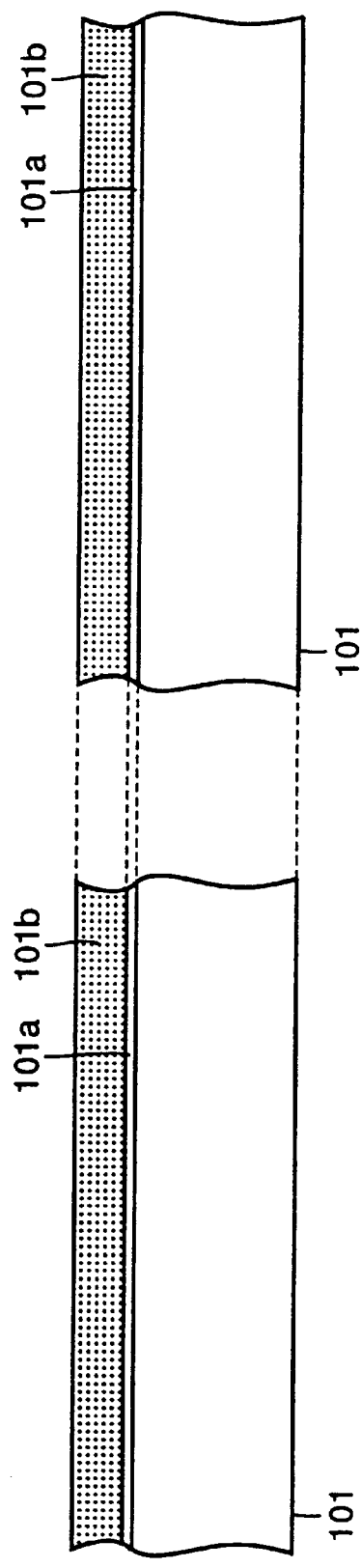
Figure 22:
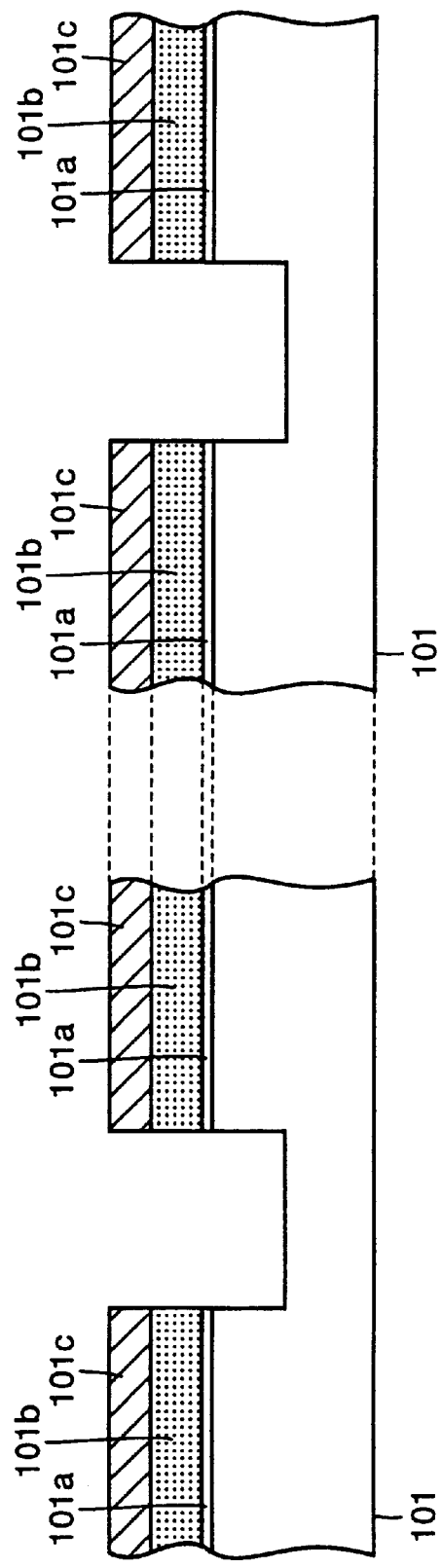
Figure 23:
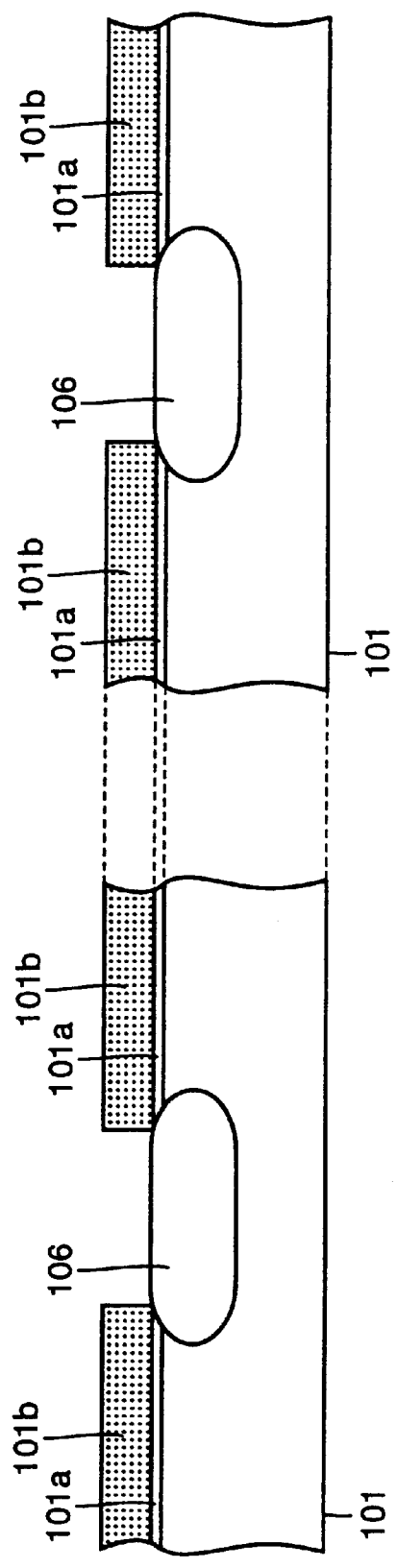
Figure 24:
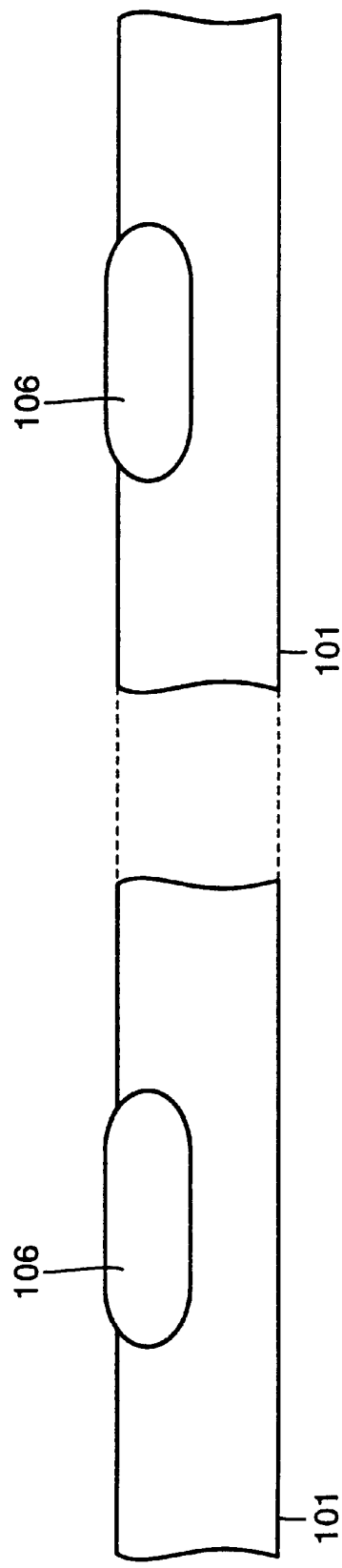
Figure 25:
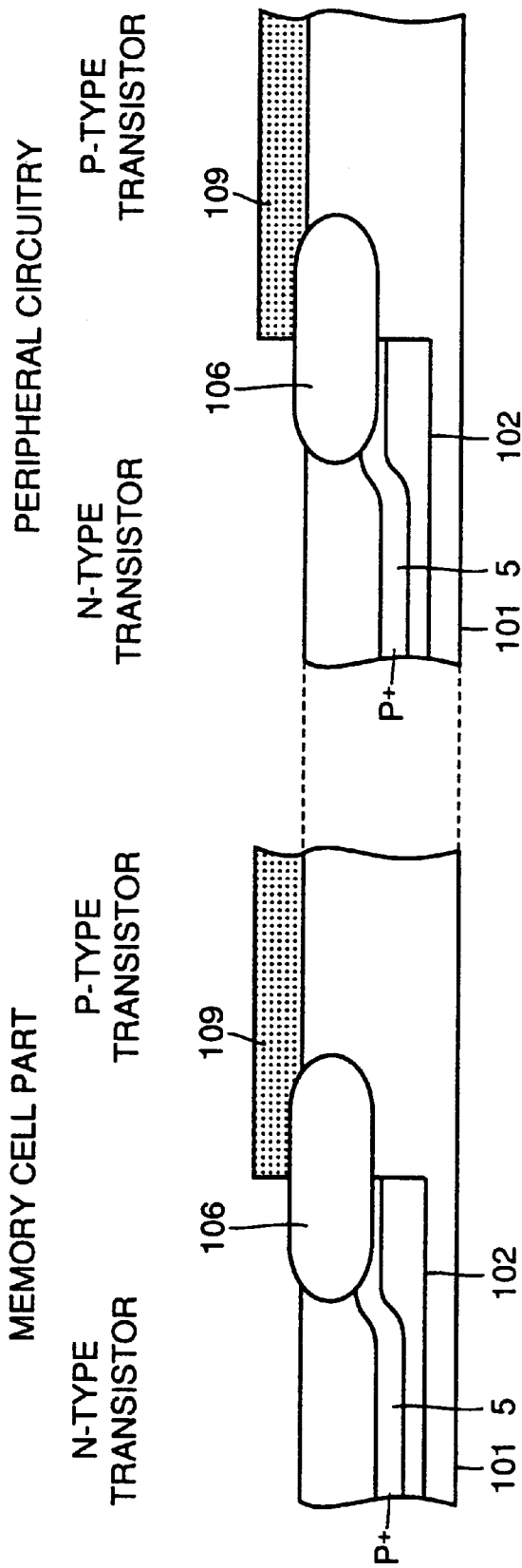
Figure 26:
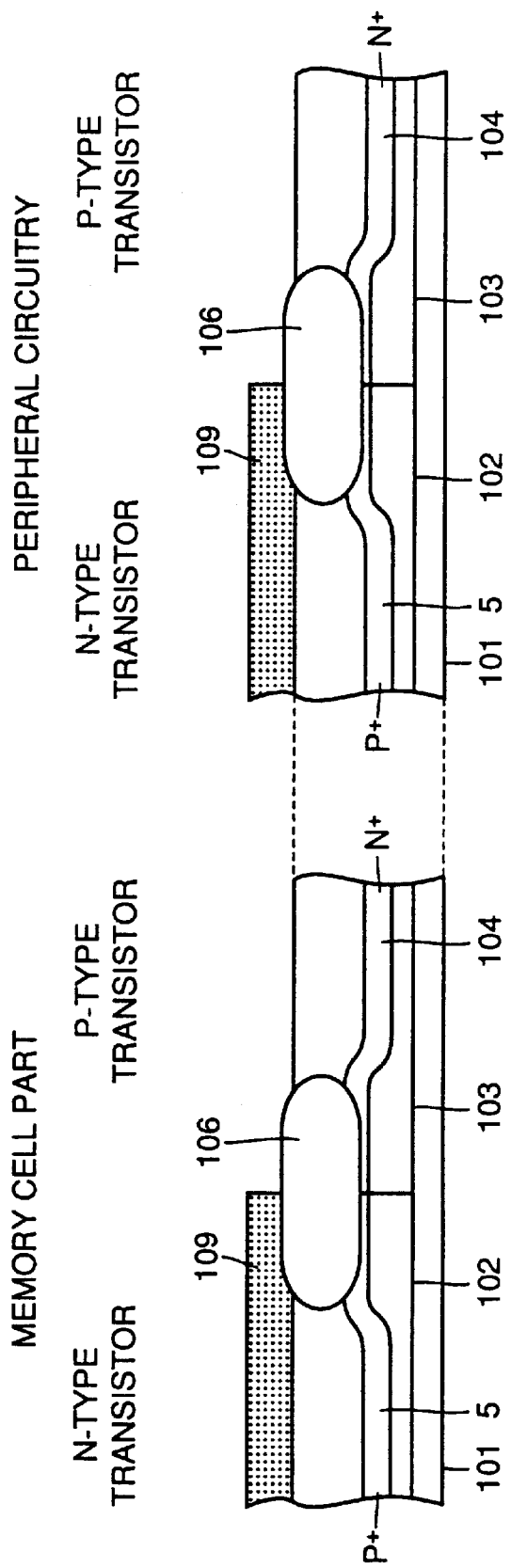
Figure 27:
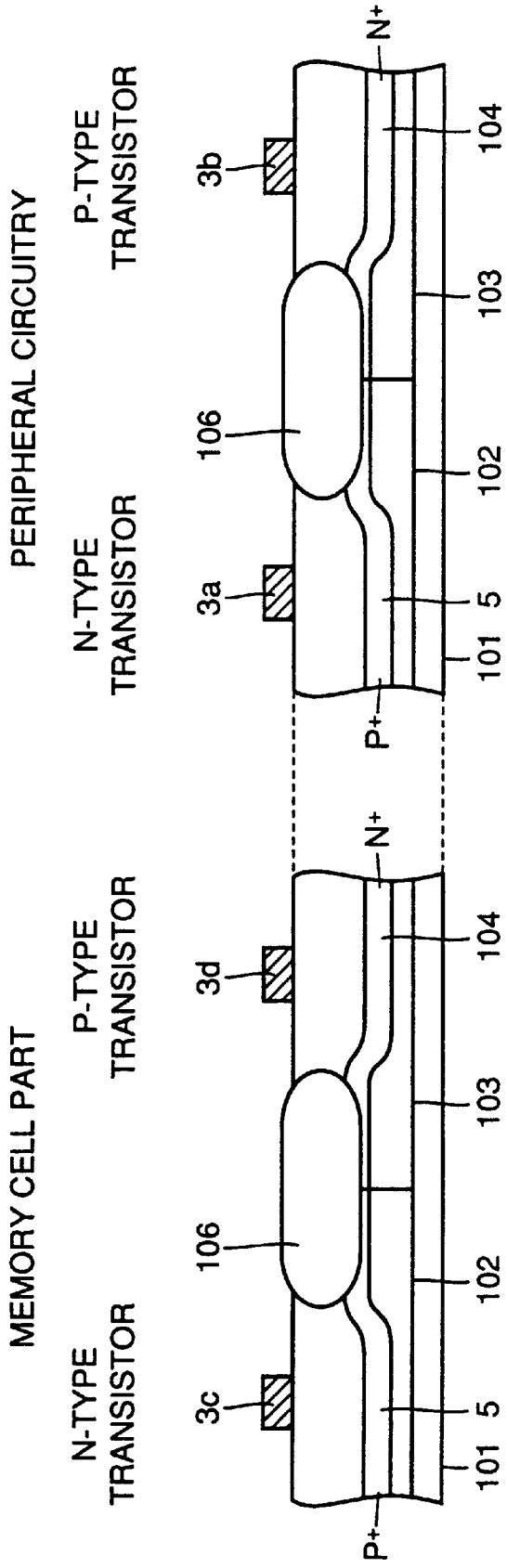
Figure 28:
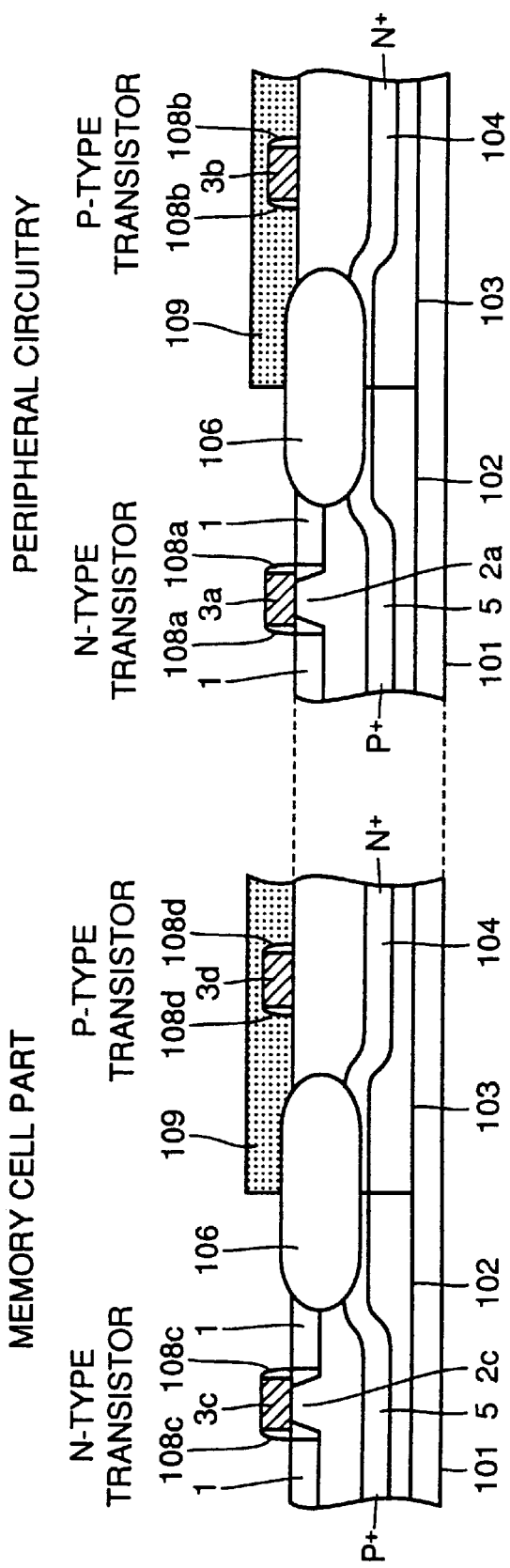
Figure 29:
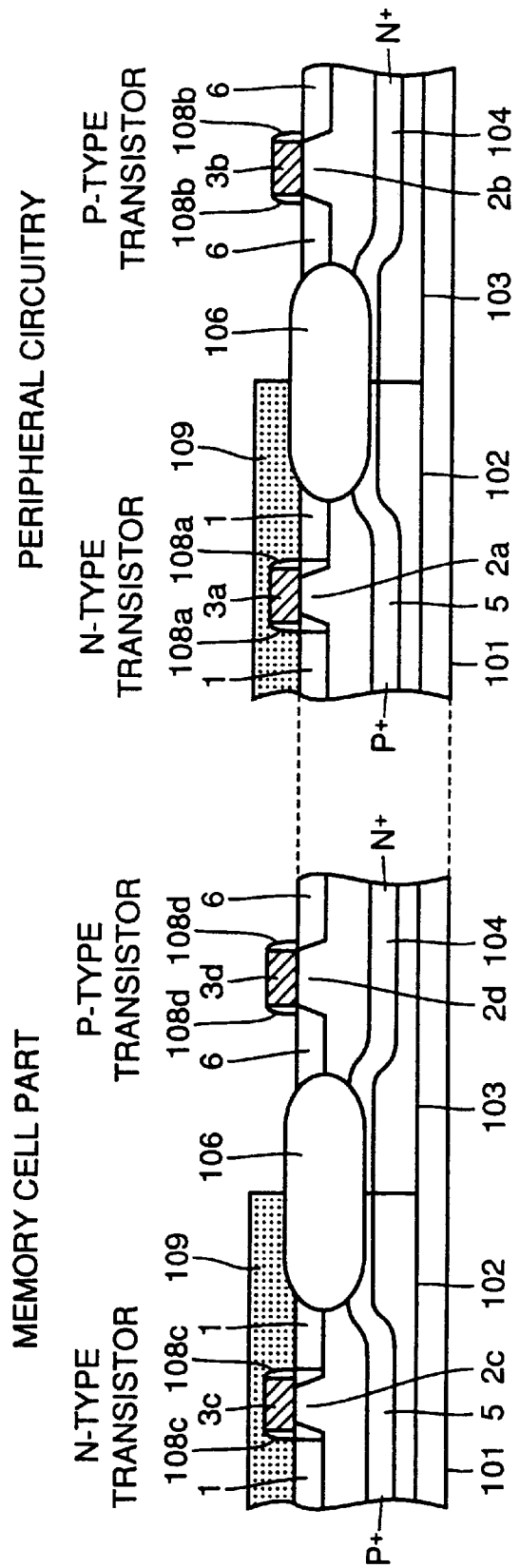

In the first embodiment, N-type well 105 forming the P-type transistor in the memory cell part and P-type active layer 107 forming the source/drain regions are relatively shallow as compared with the prior art shown in FIG. 19.

Such a structure may be employed that P-type well 102 forming the N-type transistor in the memory capacitor and N-type active layer 1 forming the source/drain regions are shallow.

In general, the P-type active region existing in the N-type well and the N-type active region existing in the P-type well are isolated by a width larger than the isolation width between active regions of the same conductivity type. More specifically, the latter isolation width is 1 $\mu$m under the design rule of 0.3 $\mu$m, while the former isolation width is 0.3 $\mu$m. This increases the memory size.

In the first embodiment, N-type well 105 and P-type active region 107 in the memory cell part are shallow. According to this structure, it was found that generation of latch-up was suppressed, and even the LOCOS isolation could set the isolation width to 0.3 $\mu$m.

Figure 30:
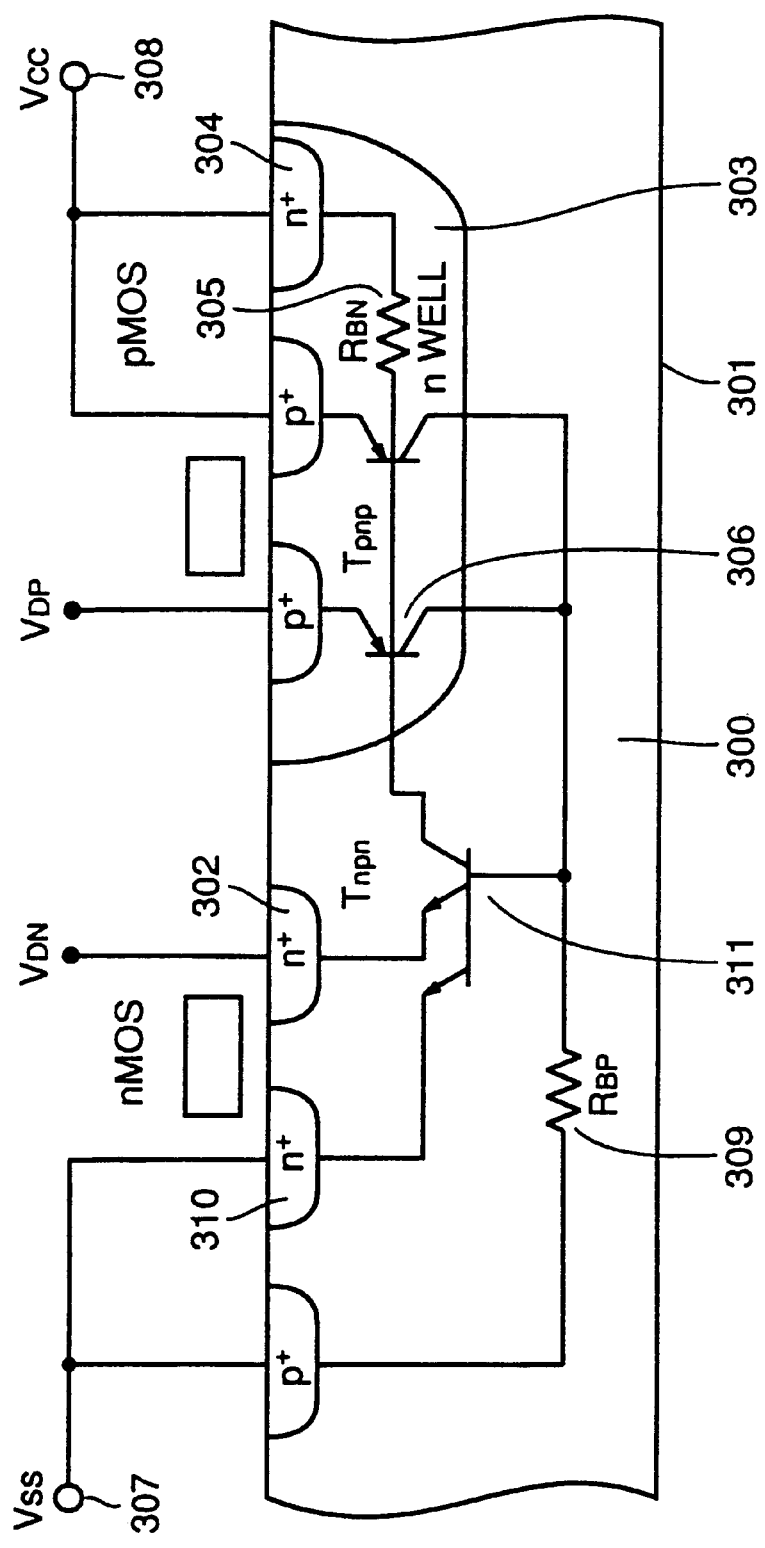
FIG. 30 is a cross section showing a parasitic thyristor structure of a bulk CMOS.
Figure 31:
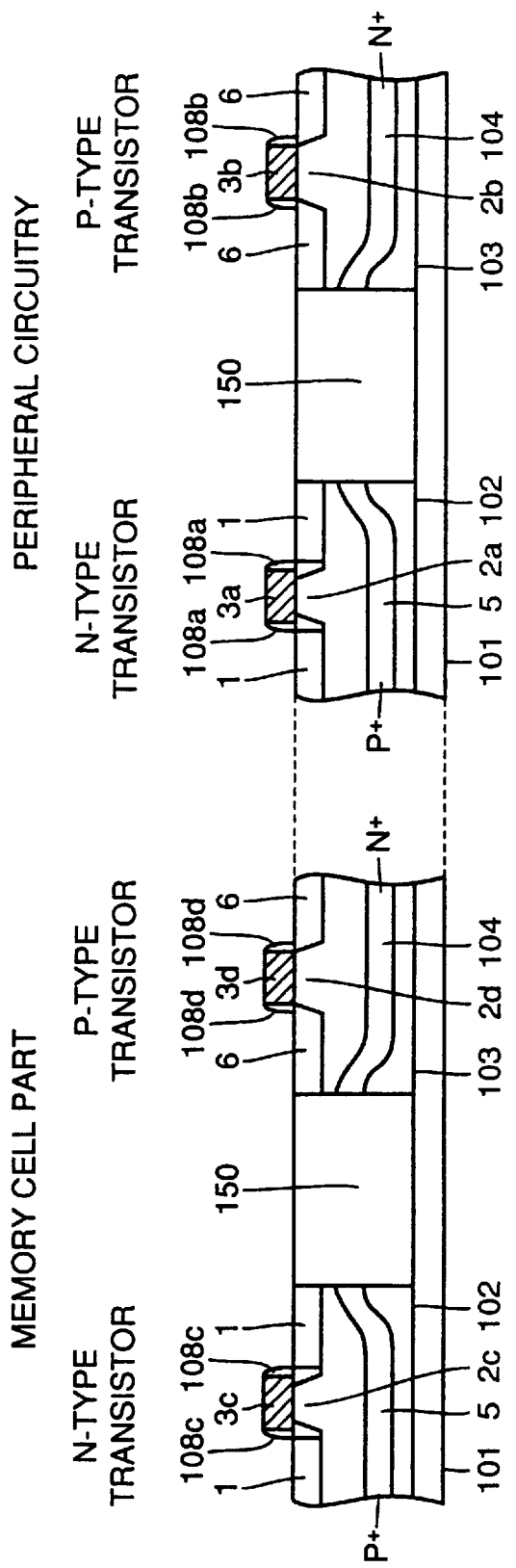
FIG. 31 is a cross section showing a conventional semiconductor memory device using trench isolation.
Figure 32:
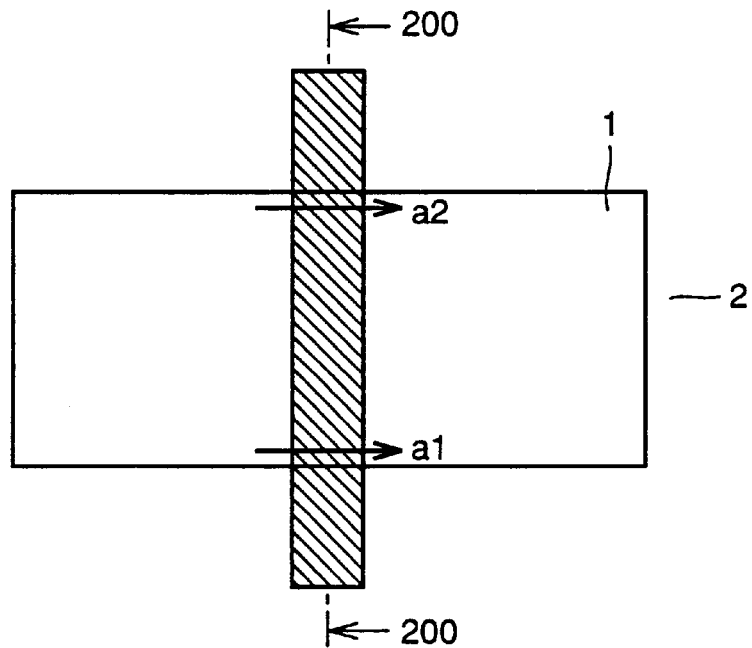
FIG. 32 is a plan showing a problem of the conventional semiconductor memory device shown in FIG. 19.
Figure 33:
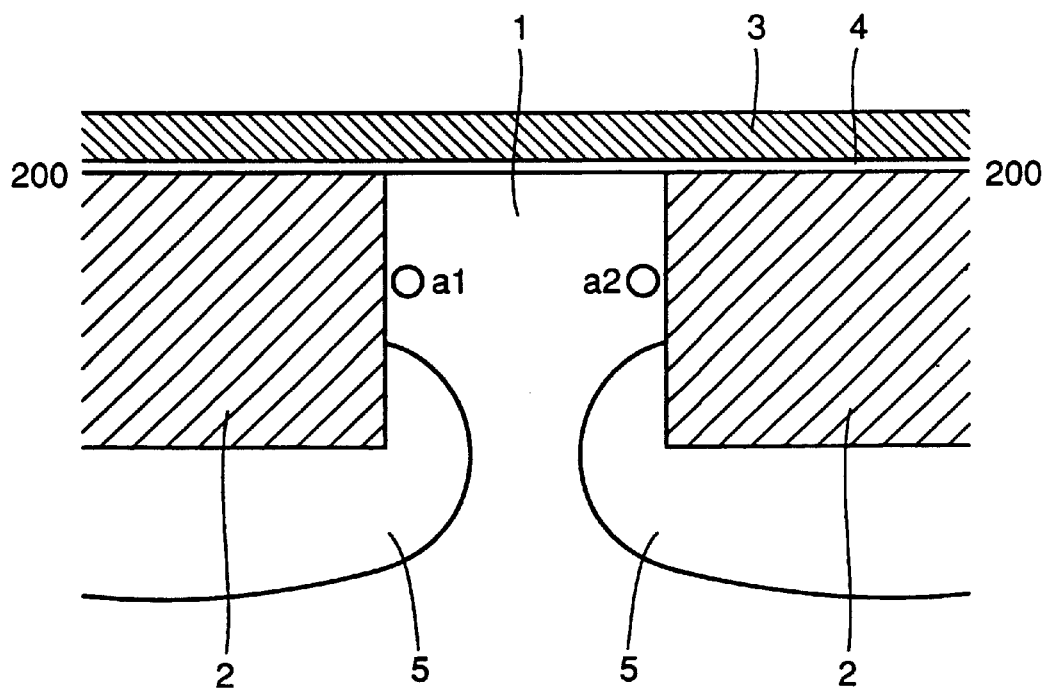
FIG. 33 is a cross section showing a problem of the conventional semiconductor memory device shown in FIG. 19.

The reason for the above is that the resistance value of resistance 305 in FIG. 30, which may cause latch-up as already described in connection with the prior art, is reduced owing to contact of the $n^+$-region and n-type well region. More specifically, since a potential difference generated by resistance 305 is small, turn-on of pnp transistor 306 is suppressed. Therefore, the problem of generation of latch-up is suppressed.

Meanwhile, since P-type active layer 107 is shallow, the resistance of active region is high, so that the performance of P-type transistor in the memory cell part is lowered. More specifically, in the conventional structure shown in FIG. 19, a drain current Id is in a range from 1 to 3 mA under the conditions of gate voltage Vg of 3 V, drain voltage Vd of 3 V, channel length L of 0.3 $\mu$m and channel width W of 10 $\mu$m, while drain current Id is in a range from 0.001 mA to 0.2 mA under the same conditions in the first embodiment.

Figure 18:
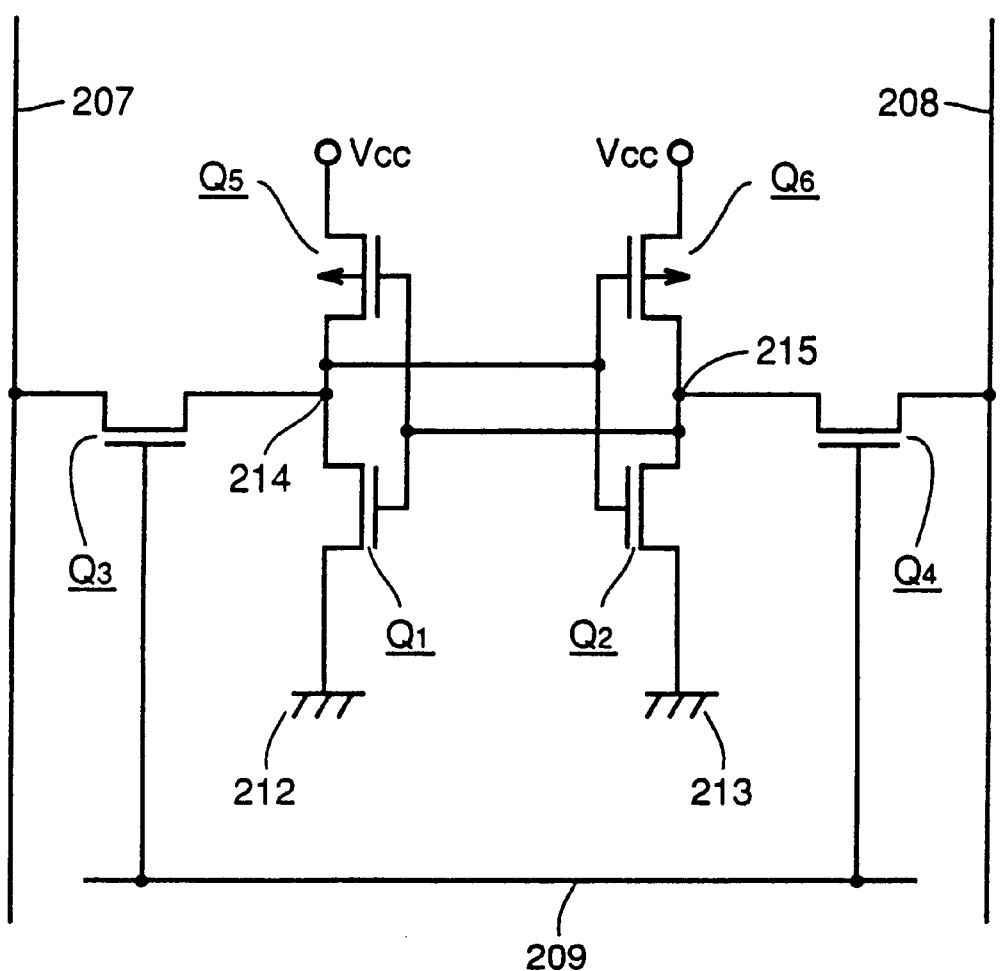
FIG. 18 is an equivalent circuit diagram of an conventional SRAM.

However, it was found that operation could be performed sufficiently with a voltage not higher than 3 V even if a P-type transistor of a lowered performance was used. In an SRAM memory cell using a TFT as a load transistor, a subthreshold leak current of driver transistors (Q1 and Q2 in FIG. 18) is larger than a current of load transistors (Q5 and Q6 in FIG. 18). Therefore, a potential at a "High" side of a storage node lowers. Consequently, in the SRAM memory cell using a TFT as a load transistor, it is difficult to perform reading with a low voltage. However, in the substrate P-type transistor in the first embodiment, current Id is in a range from 0.05 $\mu$A to 10$\mu$A with cell dimensions of L=0.3 $\mu$m and W=0.5 $\mu$m, so that current Id can exceed the subthreshold leak current of 0.001 $\mu$A of the driver transistor. Consequently, it is possible to prevent lowering of the potential at the "High" side of the storage node. Further, since the P-type transistor in the peripheral circuitry has the same structure as the conventional transistor, fast circuit operation is allowed. Although the structure has been exemplified in connection with the SRAM memory cell part, the structure may be used in the case where the P-type transistor should be formed at a portion of a small area determined by a pitch of a memory cell array. Further, it may be used in a memory cell part of another memory such as a DRAM or a nonvolatile memory.

The foregoing is allowed owing to the fact that no problem arises even if the P-type MOS transistor in the memory cell part has a lower performance (lower Id) than that in the peripheral region, so that channel implantation required for a conventional P-type MOS transistor can be eliminated.

Referring to FIGS. 2–8, a process of manufacturing the semiconductor memory device of the first embodiment will be described below. As already described in connection with the prior art, steps similar to those in FIGS. 20–24 are performed to form element isolating insulation films 106a and 106. Element isolating insulation film 106a in the memory cell part is formed to have a smaller size than element isolating insulation film 106 in the peripheral circuitry. Thereafter, the region at which the P-type transistor of the peripheral circuitry is to be formed is covered with resist 109, and P-type impurity is ion-implanted to form P-type well 102 and P+-isolation region 5 in both the memory cell part and peripheral circuitry.

Figure 3:
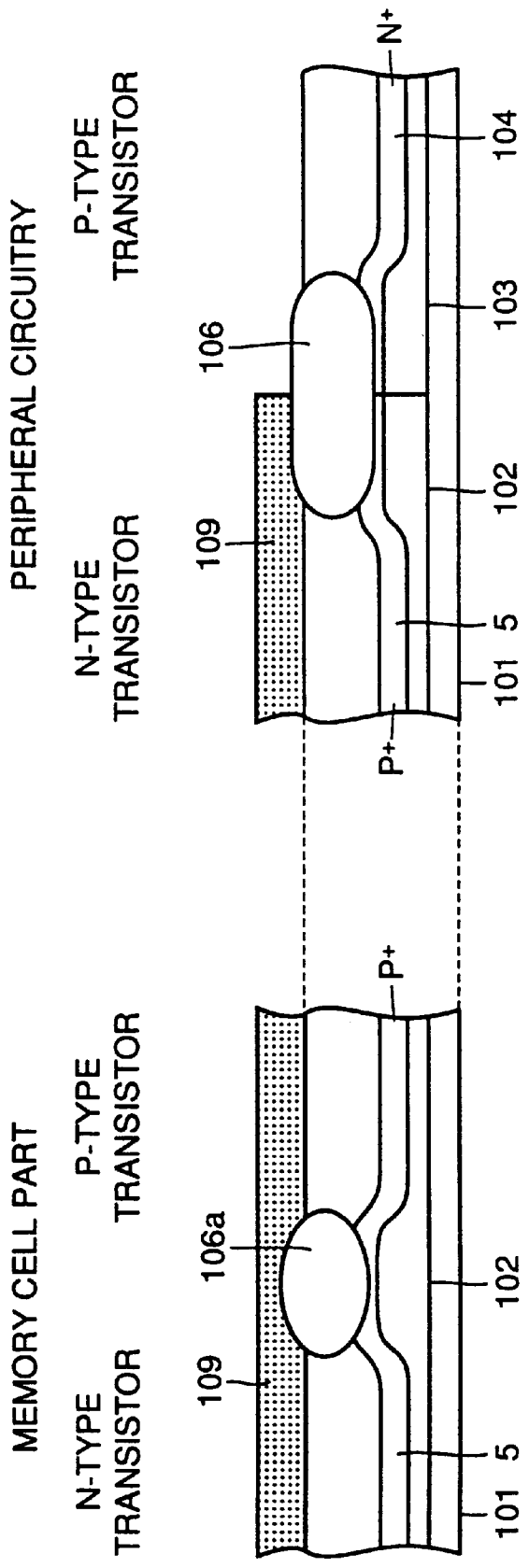

As shown in FIG. 3, resist 109 is formed to cover the whole surface of the memory cell part and the region at which the N-type transistor of the peripheral circuitry is to be formed, and ion-implantation is performed to form N-type well region 103 and N+-isolation region 104 only at the region for forming the P-type transistor of the peripheral circuitry.

Figure 4:
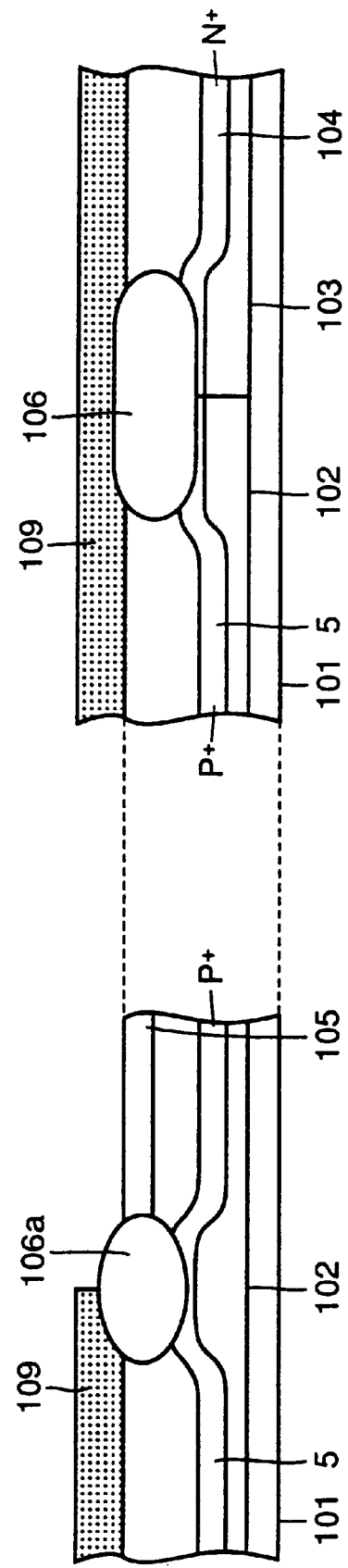

As shown in FIG. 4, resist 109 is formed to cover the region for forming the N-type transistor in the memory cell part and the whole surface of the peripheral circuitry, and ion-implantation is performed to form N-type well 105 at the region for forming the P-type transistor of the memory cell part.

Even in the case where isolation is formed after forming the wells, a similar manner can be employed if the P-type transistor of the memory cell has a shallow N-type well and shallow P+-type source/drain regions.

Figure 5:
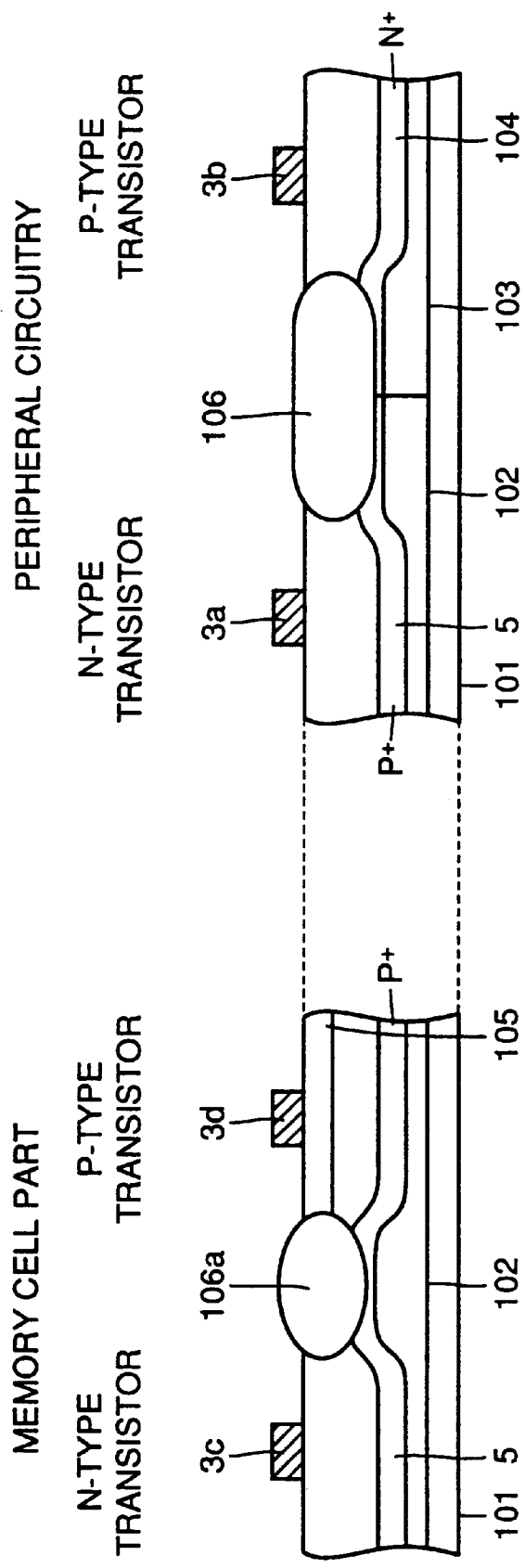
Figure 6:
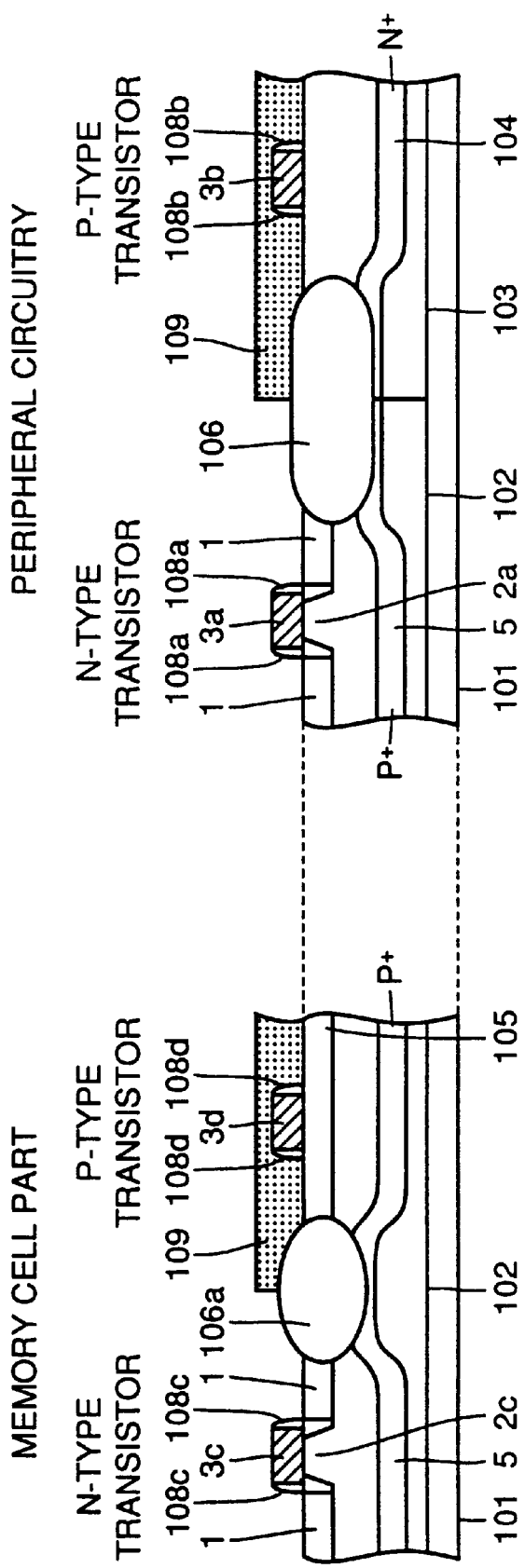

Thereafter, as shown in FIG. 5, gate electrodes 3a, 3b, 3c and 3d made of N-type polycrystalline silicon are formed at predetermined regions on the semiconductor substrate, and then resist 109 is formed to cover regions at which the P-type transistors of both the memory cell part and peripheral circuitry are to be formed. Thereafter, using gate electrodes 3c and 3a as a mask, N-type impurity is implanted into regions at which the N-type transistors of both the memory cell part and peripheral circuitry are to be formed, whereby lightly doped impurity regions are formed. After removing resist 109, side wall insulation films 108a, 108b, 108c and 108d are formed in contact with opposite surfaces of gate electrodes 3a, 3b, 3c and 3d as shown in FIG. 6, respectively. Using side wall insulation films 108c and 108a as a mask, ion implantation is performed again to form heavily doped impurity regions, whereby source/drain regions 1 of the LDD (Lightly Doped Drain) structure are formed. Thereafter, resist 109 is removed.

Figure 7:
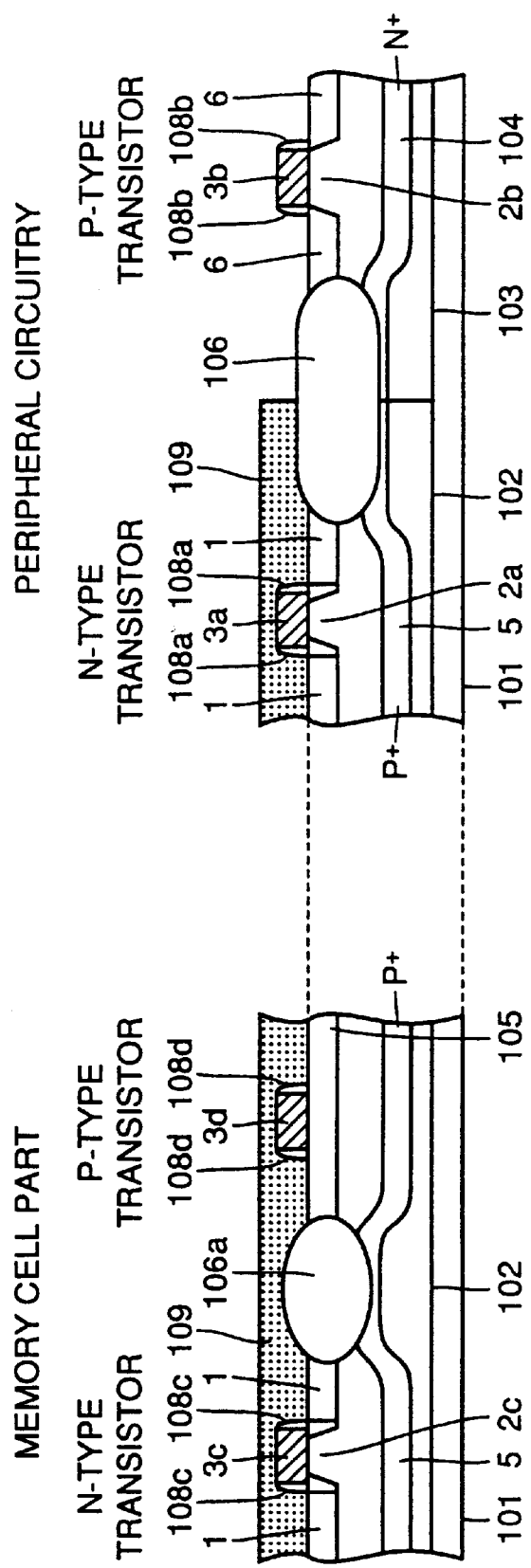

As shown in FIG. 7, resist 109 is formed to cover the region for forming the N-type transistor in the peripheral circuitry and the whole surface of the memory cell part, and P-type impurity is ion-implanted to form source/drain regions 6 only in the region for forming the P-type transistor of the peripheral circuitry. Thereafter, resist 109 is removed.

Figure 8:
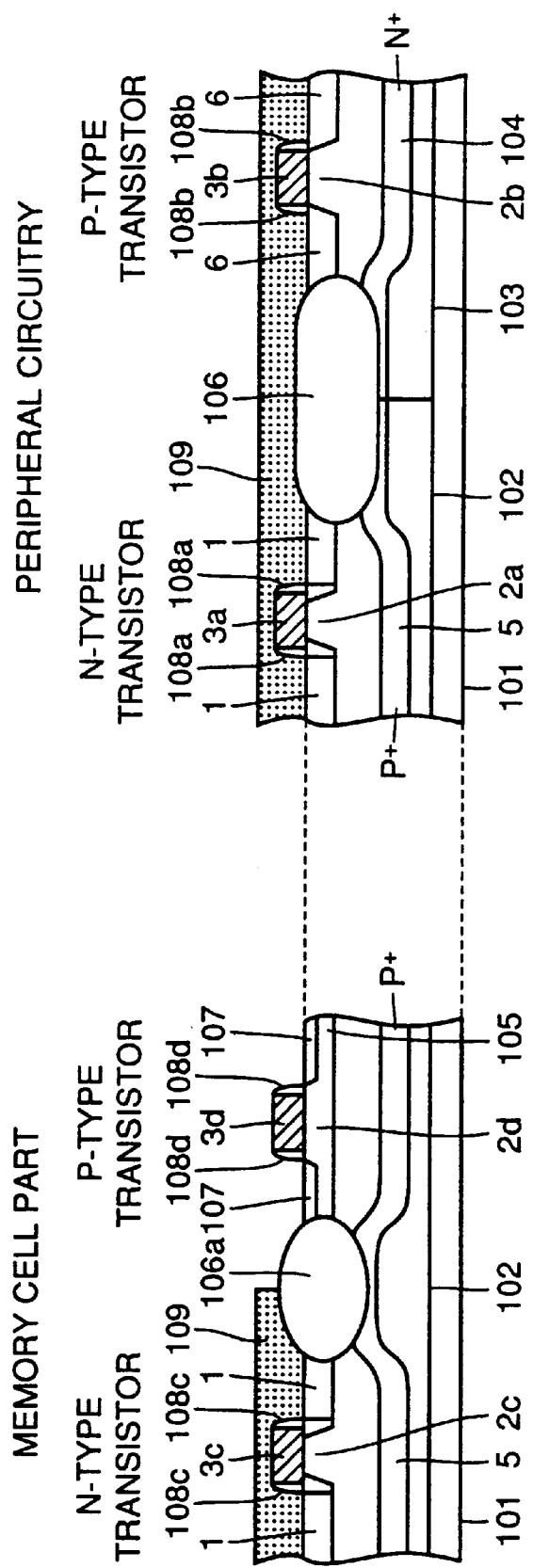

As shown in FIG. 8, resist 109 is formed to cover the region for forming the N-type transistor of the memory cell part and the whole surface of the peripheral circuitry, and ion-implantation is performed to form source/drain regions 107 only in the region for forming the P-type transistor of the memory cell part.

As described above, it is preferable to perform the implantation for the source/drain regions of the P-type MOS transistor in the memory cell part at the last step. If this implantation were performed at an earlier step, impurity implanted at a subsequent thermal processing step would diffuse, which would impede formation of a shallow junction.

In this manner, the semiconductor memory device of SRAM of the first embodiment shown in FIG. 1 is completed.

In the above steps, implantation of phosphorus for forming the N-type well in the peripheral circuitry is performed with 300–1500 KeV, and implantation of $BF_2$ for forming the P-type source/drain regions in the peripheral circuitry is performed with 15–25 KeV. Implantation of phosphorus for forming the N-type well in the memory cell part is performed with 30–100 KeV, and implantation of $BF_2$ for forming the P-type source/drain regions in the memory cell part is performed with 5–10 KeV. With these conditions, good characteristics is obtained.

According to the first embodiment described above, the regions of N-type and P-type transistors in the memory cell part can be isolated sufficiently from each other by the LOCOS isolation of a small width, and the following effects can be achieved.

First, in contrast to use of the trench isolation which complicates the manufacturing steps, use of the LOCOS isolation can simplify the manufacturing steps, and allows easy manufacturing of the semiconductor memory device.

Since the LOCOS isolation is used, it is not necessary to prevent parasitic MOS operation.

Further, the LOCOS isolation can suppress a problem relating to junction leak.

Further, in the structure where P-type transistors are formed on the substrate, sizes of the memory cells can be reduced because isolation between wells can be narrow owing to the LOCOS isolation of a small width.

Finally, operation can be performed with a low voltage not higher than 3 V.

Second Embodiment

Figure 9:
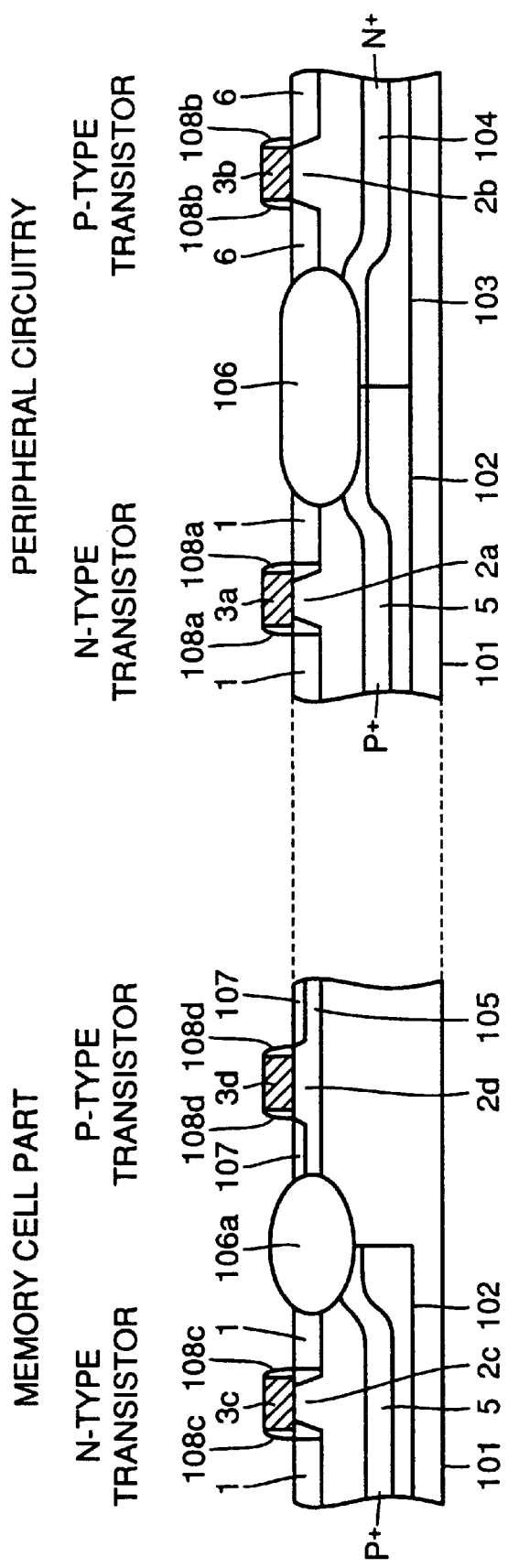
FIG. 9 is a cross section showing a semiconductor memory device of a second embodiment of the invention.

Referring to FIG. 9, a structure of a second embodiment is basically similar to that of the first embodiment shown in FIG. 1, and only differences will be described below. The second embodiment differs from the first embodiment in that P-type well 102 formed at the region for forming the N-type transistor does not have an extended portion located at the region for forming the P-type transistor of the memory cell part. Therefore, in the second embodiment, an area through which the N-type and P-type wells are in direct contact with each other is reduced in size or eliminated, so that formation of a parasitic PNP bipolar transistor (see FIG. 30) causing latch-up is suppressed. Therefore, this effect is added to the effects of the first embodiment, and generation of latch-up can be prevented further effectively.

Further, in addition to the effect by the first embodiment, the second embodiment can easily fix a potential of the N-type well which is required for stable operation of the transistor. More specifically, since N-type well 105 is electrically independent from P-type well 102, the potential of N-type well can be fixed at the N-type substrate. Meanwhile, in the first embodiment, N-type well 105 exists in P-type well 102, so that the potentials of N-type wells must be individually fixed.

Figure 10:
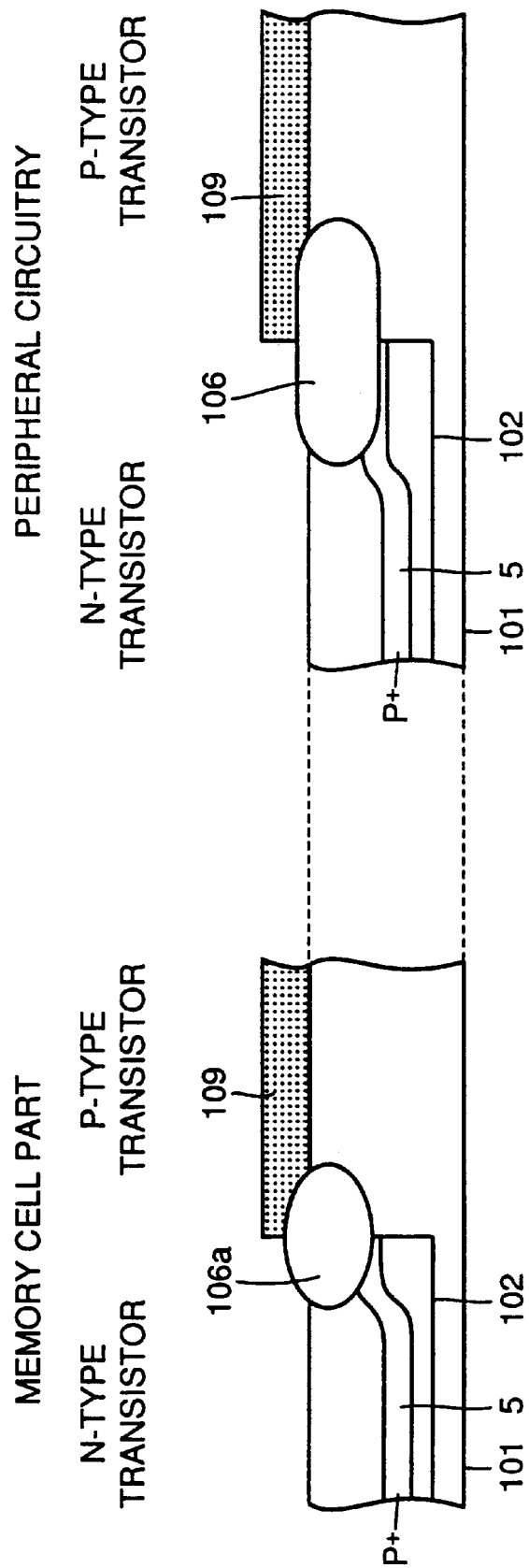
FIGS. 10–16 are cross sections showing 1st through 7th steps in a process of manufacturing the semiconductor memory device of the second embodiment of the invention shown in FIG. 9.
Figure 11:
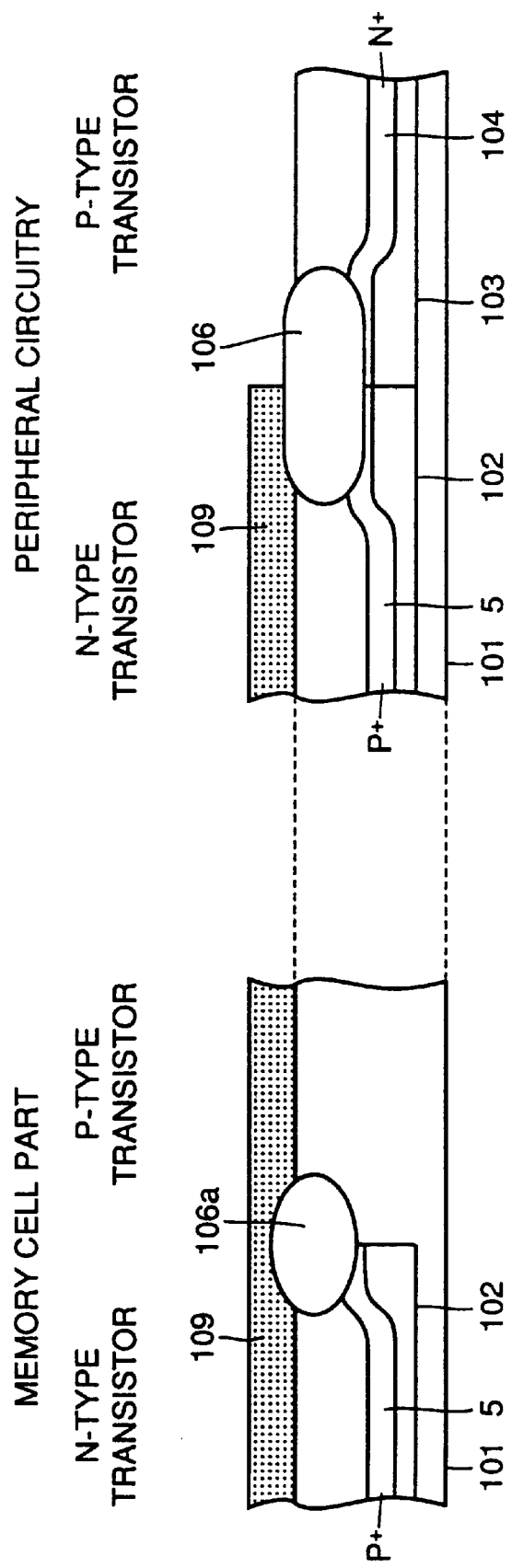
Figure 12:
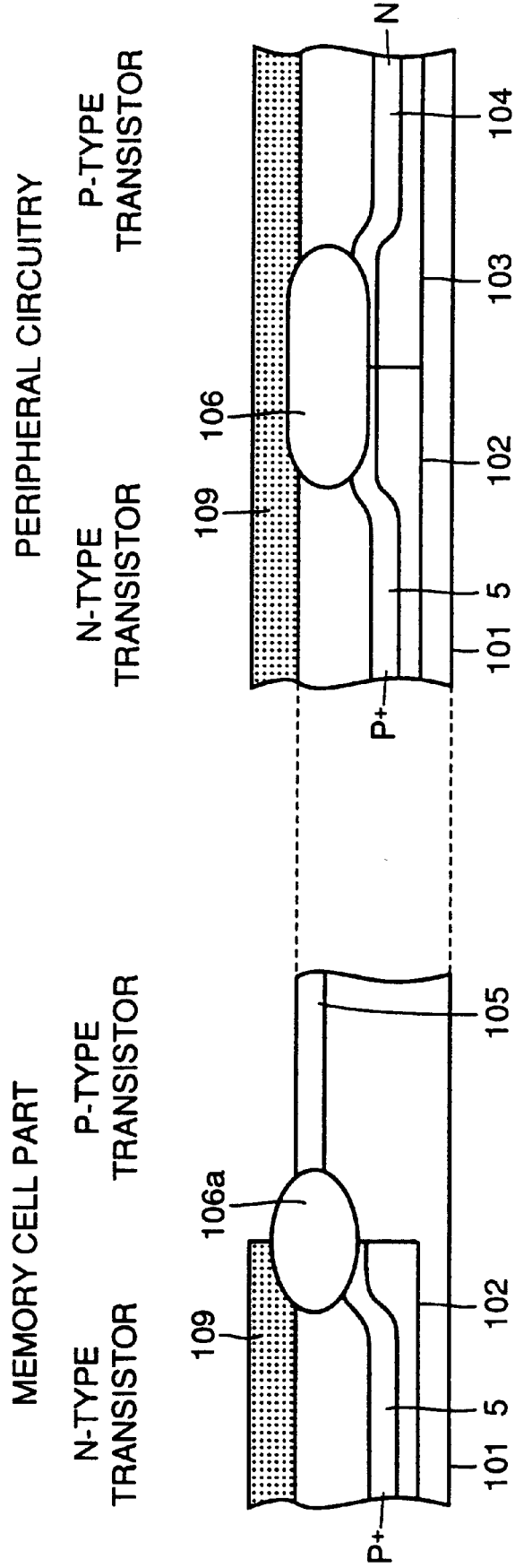

Referring to FIGS. 10 through 16, a process of manufacturing the semiconductor memory device of the second embodiment will be described below. As shown in FIG. 10, element isolating insulation films 106 and 106a are formed at predetermined positions on the main surface of semiconductor substrate 101 by the LOCOS method. At this step, element isolating insulation film 106a in the memory cell part is formed to have a smaller size that element isolating insulation film 106 in the peripheral circuitry. Thereafter, resist 109 is formed to cover regions for forming the P-type transistors in both the peripheral circuitry and memory cell part, and P-type well 102 and P⁺-isolation region 5 are formed by ion implantation in both the memory cell part and peripheral circuitry. As shown in FIG. 11, resist 109 is formed to cover the whole surface of the memory cell part and the region for forming the N-type transistor in the peripheral circuitry, and N-type well 103 and N⁺-isolation 104 are formed by ion implantation only in the region for forming the P-type transistor in the peripheral circuitry. As shown in FIG. 12, resist 109 is formed to cover the region for forming the N-type transistor in the memory cell part and the whole surface of the peripheral circuitry, and N-type well 105 is formed by ion implantation only at the region for forming the P-type transistor in the memory cell part.

Figure 13:
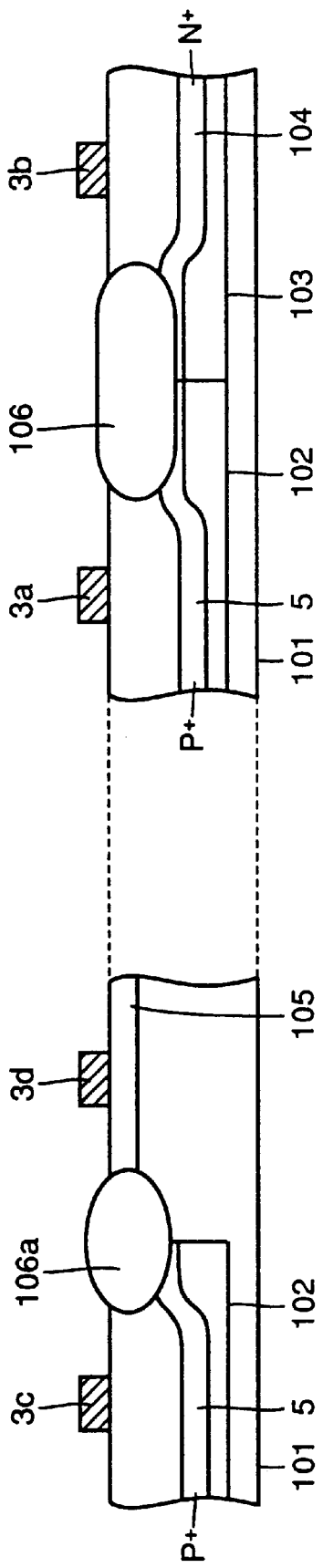
Figure 14:
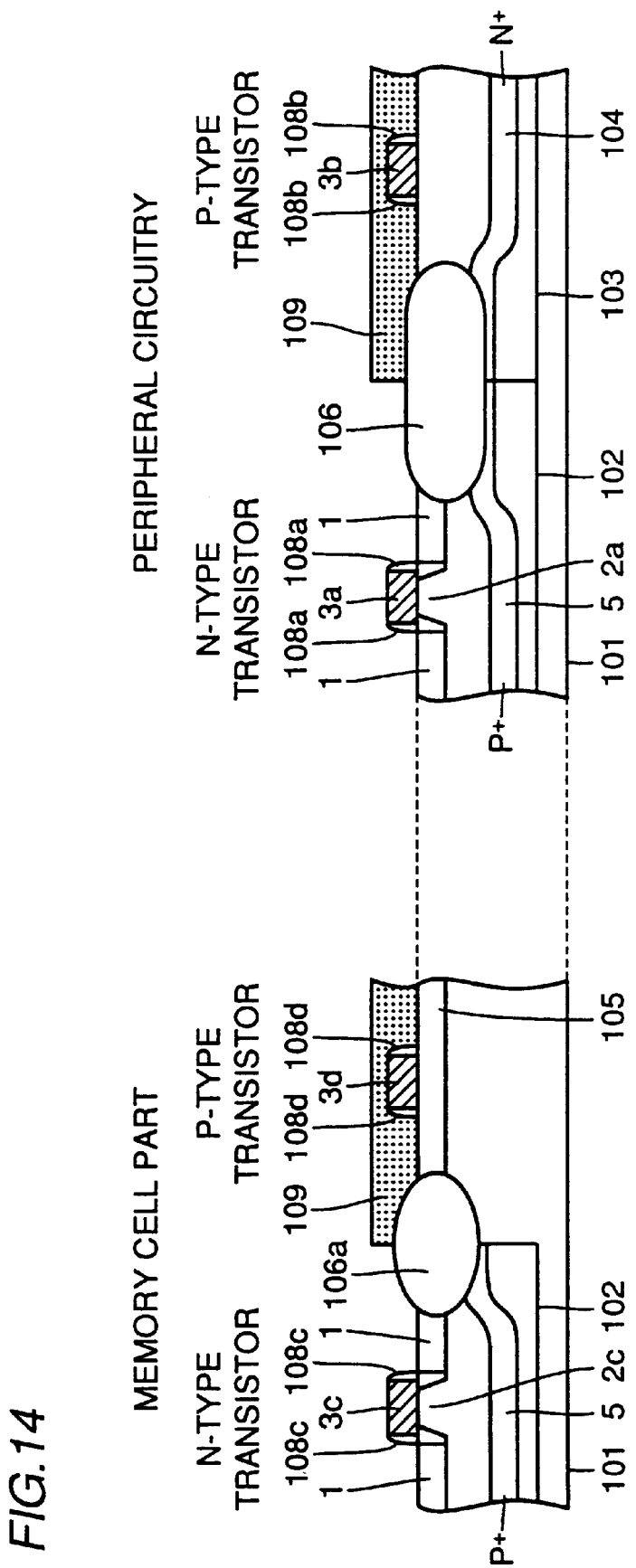

Then, as shown in FIG. 13, after forming gate electrodes 3a, 3b, 3c and 3d made of N-type polycrystalline silicon at predetermined regions on the semiconductor substrate, resist 109 is formed to cover regions at which the P-type transistors of both the memory cell part and peripheral circuitry are to be formed. Then, N-type impurity is lightly implanted into regions, at which the N-type transistors of both the memory cell part and peripheral circuitry are to be formed, using gate electrodes 3c and 3a as a mask, whereby lightly doped impurity regions are formed. After removing resist 109, side wall insulation films 108a, 108b, 108c and 108d are formed in contact with opposite side surfaces of gate electrodes 3a, 3b, 3c and 3d as shown in FIG. 14, respectively. Using side wall insulation films 108c and 108a as a mask, ion implantation is performed again to form heavily doped impurity regions, whereby source/drain regions 1 of the LDD (Lightly Doped Drain) structure are formed. Thereafter, resist 109 is removed.

Figure 15:
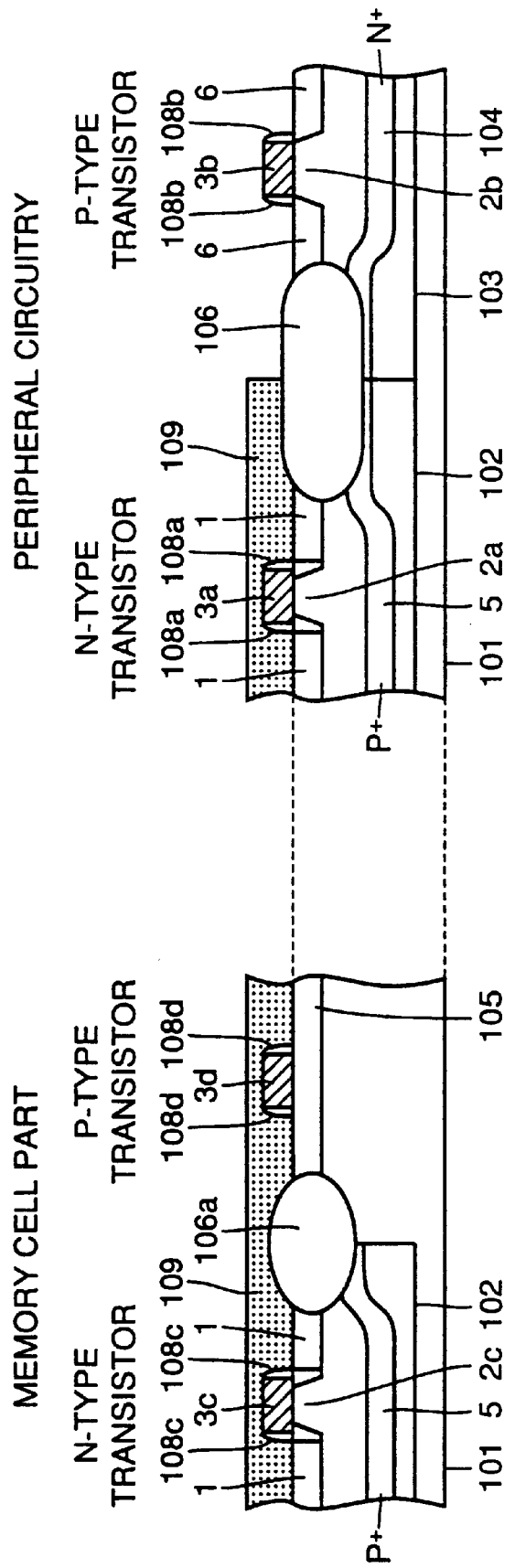

As shown in FIG. 15, resist 109 is formed to cover the region for forming the N-type transistor in the peripheral circuitry and the whole surface of the memory cell part, and P-type impurity is ion-implanted to form source/drain regions 6 only at the region for forming the P-type transistor of the peripheral circuitry. Thereafter, resist 109 is removed.

Figure 16:
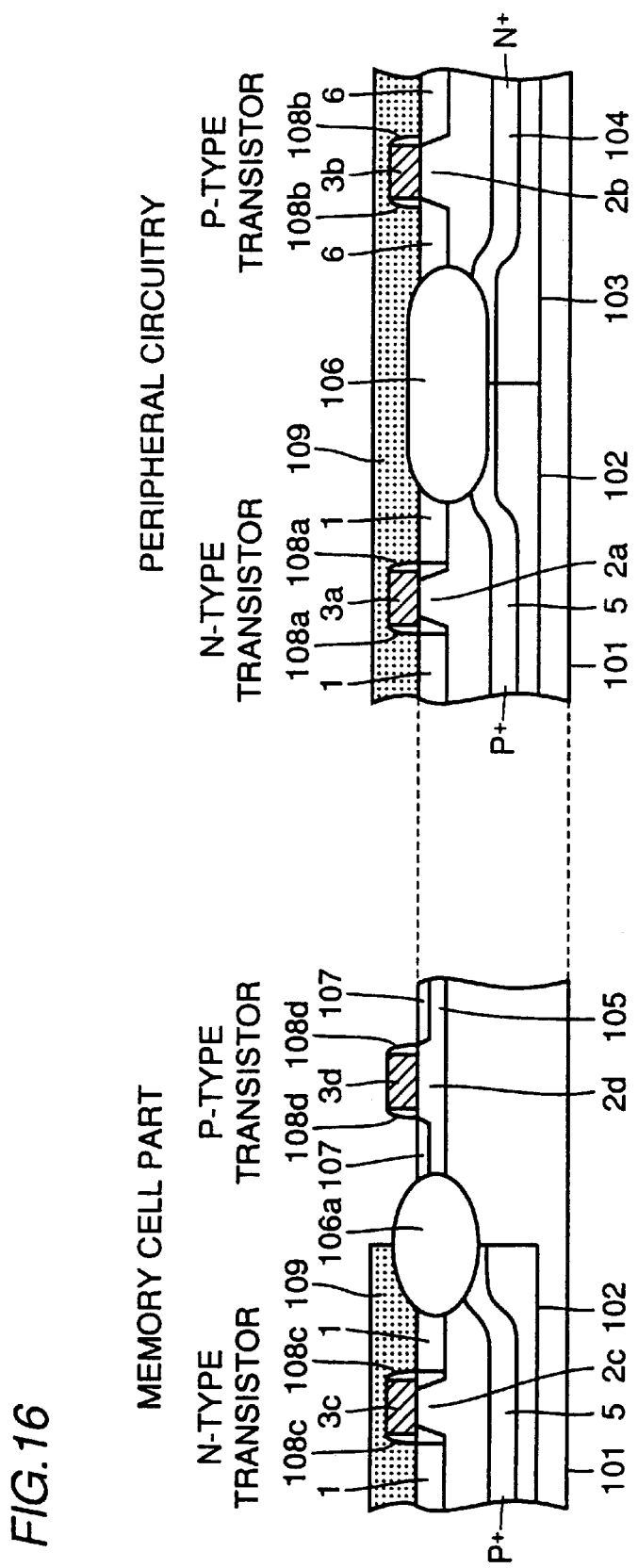

As shown in FIG. 16, resist 109 is formed to cover the region for forming the N-type transistor of the memory cell part and the whole surface of the peripheral circuitry, and ion-implantation is performed to form source/drain regions 107 only at the region for forming the P-type transistor of the memory cell part.

In this manner, the semiconductor memory device of SRAM of the second embodiment is completed as shown in FIG. 9.

Third Embodiment

Figure 17:
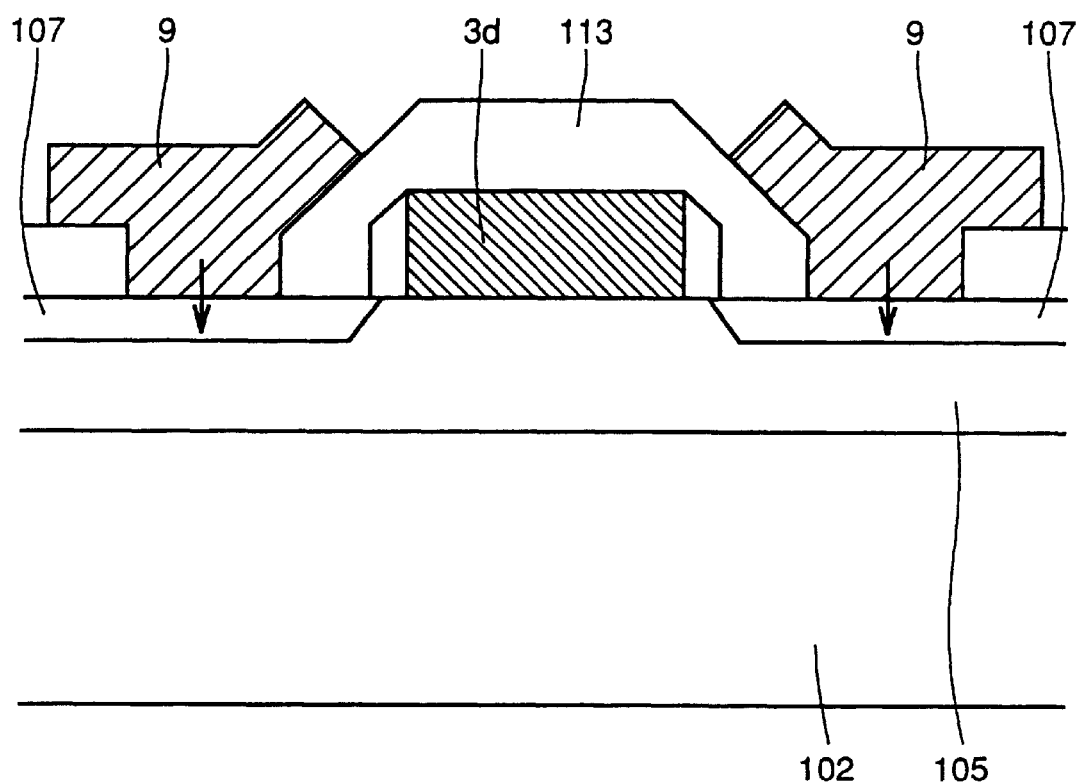
FIG. 17 is a cross section showing a process of manufacturing a semiconductor memory device of a third embodiment of the invention.

Referring to FIG. 17, a third embodiment relates to introduction of impurity for forming the source/drain regions of the P-type transistors of the first and second embodiments already described. Steps other than the steps of forming the source/drain regions are the same as those in the first and second embodiments, and thus will not be described below.

A step shown in FIG. 17 corresponds to the step shown in FIG. 8 of the first embodiment and the step shown in FIG. 16 of the second embodiment. A gate electrode 3d is covered with an interlayer oxide film 113. A second polycrystalline silicon layer 9 is formed in close contact with a predetermined region of the semiconductor substrate. Second polycrystalline silicon layer 9 may be formed of a single layer of N-type polycrystalline silicon or may have a two-layer structure formed of a polycrystalline silicon layer and a silicide layer.

After forming second polycrystalline silicon layer 9, P-type impurity for forming the source/drain regions are implanted from a position above second polycrystalline silicon layer 9. Implanted P-type impurity exists in second polycrystalline silicon layer 9. Thereafter, heat treatment is performed to diffuse the P-type impurity into the surface of semiconductor substrate 102. Thereby, source/drain regions 107 of the P-type transistor are formed. According to this method, the depth of the source/drain regions can be further reduced, and the degree or scale of the heat treatment for forming the source/drain regions of memory cell can be reduced. Thus, the method of this embodiment can stably and easily form the shallow P-type source/drain regions.

According to the semiconductor memory device of one aspect of the invention, as described above, the depth of the source/drain regions of the second conductivity type in the memory cell part is shallower than the depth of the source/drain regions of the second conductivity type in the peripheral circuitry, and the depth of the well of the first conductivity type in the memory cell part is shallower than the depth of the well of the first conductivity type in the peripheral circuitry, so that the element isolating insulation film in the memory cell part can be reduced in size, and consequently the cell size can be reduced.

In the embodiment depicted in FIG. 34, wherein elements similar to those of FIG. 1 bear similar reference numerals, the depth of the third well region 102 in the memory cell part is shallower than the depth of the corresponding fourth well region in the peripheral circuitry, and the depth of the third source/drain regions 1 in the memory cell part is shallower than the depth of the corresponding fourth source/drain regions 1 in the peripheral circuitry.

According to the method of manufacturing the semiconductor memory device of another aspect of the invention, the semiconductor memory device including the small element isolating insulation film in the memory cell part can be formed easily, so that the cell size can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell region and a peripheral circuit region, and comprising:

a first well region of a first conductivity type formed at a main surface of a semiconductor substrate in said memory cell region and having a first depth from the main surface of the semiconductor substrate;

a pair of first source/drain regions of a second conductivity type formed at predetermined regions of a main surface of said first well region, having a second depth from the main surface of said first well region, and spaced by a predetermined distance from each other with a first channel region therebetween;

a first gate electrode formed on said first channel region with a first gate insulation film therebetween;

a first element isolating insulation film formed at a main surface of said memory cell region and located at a region neighboring to said first source/drain regions;

a second well region of the first conductivity type formed at the main surface of said semiconductor substrate in said peripheral circuit region and having a third depth from the main surface of said semiconductor substrate;

a pair of second source/drain regions of the second conductivity type formed at predetermined regions of a main surface of said second well region, having a fourth depth from the main surface of said second well region, and spaced by a predetermined distance with a second channel region therebetween;

a second gate electrode formed on said second channel region with a second gate insulation film therebetween;

a second element isolating insulation film formed at a region located in the main surface of said peripheral circuit region and neighboring to said second source/drain regions, a pair of third source/drain regions of the first conductivity type having a fifth depth from the main surface of the semiconductor substrate and located at positions spaced by said first element isolating insulation film from said first source/drain regions; and a third well region of the second conductivity type having a sixth depth from the main surface of the semiconductor substrate and covering said third source/drain regions, wherein the first depth of said first well region is shallower than the third depth of said second well region, and the second depth of said first source/drain regions is shallower than the fourth depth of said second source/drain regions.

2. The semiconductor memory device according to claim 1, wherein the first depth of said first well region is shallower than a depth to a lower surface of said first element isolating insulation film.

3. The semiconductor memory device according to claim 1, wherein said first well region is formed in said third well region.

4. The semiconductor memory device according to claim 1, wherein said first well region does not have a portion being in contact with said third well region.

5. The semiconductor memory device according to claim 1, wherein said peripheral circuit region is provided at its main surface with a pair of fourth source/drain regions of the first conductivity type having a seventh depth and located at positions spaced by said second element isolating insulation film from said second source/drain regions, and is provided with a fourth well region of the second conductivity type having an eighth depth and covering said fourth source/drain regions, and a width of said first element isolating insulation film in a direction along the main surface of said semiconductor substrate is narrower than a width of said second element isolating insulation film in the direction along the main surface of said semiconductor substrate.

6. The semiconductor memory device according to claim 1, wherein said first and second wells are of n-type, and said first and second source/drain regions are of p-type.

7. The semiconductor memory device according to claim 1, wherein said first source/drain regions and said first gate electrode in said memory cell region form a first transistor of the first conductivity type, and said first transistor is used as a load transistor of a memory cell in a static random access memory.

8. The semiconductor memory device according to claim 7, wherein a drain current of said first transistor of the first conductivity type in the on state is in a range from 0.05 $\mu$A to 10 $\mu$A.

* * * * *